(12) United States Patent
McFarland

(10) Patent No.: US 10,747,919 B2
(45) Date of Patent: Aug. 18, 2020

(54) GENERATING PATH EXECUTION TIMES

(71) Applicant: Assurant Design Automation LLC, Kennesaw, GA (US)

(72) Inventor: M. David McFarland, Kennesaw, GA (US)

(73) Assignee: Assurant Design Automation LLC, Kennesaw, GA (US)

( * ) Notice: Subject to any disclaimer, the term of this patent is extended or adjusted under 35 U.S.C. 154(b) by 220 days.

(21) Appl. No.: 16/042,822

(22) Filed: Jul. 23, 2018

(65) Prior Publication Data

US 2018/0330023 A1 Nov. 15, 2018

Related U.S. Application Data

(63) Continuation-in-part of application No. 14/727,517, filed on Jun. 1, 2015, now abandoned.

(51) Int. Cl.
*G06F 30/327* (2020.01)
*G06F 30/30* (2020.01)
*G06F 30/33* (2020.01)

(52) U.S. Cl.
CPC .......... *G06F 30/327* (2020.01); *G06F 30/30* (2020.01); *G06F 30/33* (2020.01)

(58) Field of Classification Search
CPC ......... G06F 30/30; G06F 30/327; G06F 30/33
See application file for complete search history.

(56) References Cited

U.S. PATENT DOCUMENTS

| | | | |
|---|---|---|---|
| 4,065,915 A | 1/1978 | Farnbach | |
| 6,215,327 B1 | 4/2001 | Lyke | |
| 6,628,215 B2 | 9/2003 | Talwar et al. | |
| 6,654,950 B1 | 11/2003 | Barnishan | |
| 6,898,563 B1 | 5/2005 | McFarland | |
| 7,346,864 B2 | 3/2008 | Srouji et al. | |
| 7,605,607 B2 | 10/2009 | Ng | |
| 7,784,005 B1 | 8/2010 | Ng | |
| 7,890,896 B2 | 2/2011 | Moon | |
| 8,739,084 B2 | 5/2014 | Swann | |
| 9,112,490 B1 | 8/2015 | Hamlet et al. | |
| 9,396,298 B1 | 7/2016 | McFarland | |
| 9,535,665 B2 | 1/2017 | McFarland | |
| 9,536,029 B2 | 1/2017 | McFarland | |

(Continued)

OTHER PUBLICATIONS

U.S. Appl. No. 15/974,478, Office Action Summary, dated Jan. 8, 2020, pp. 1-23.
U.S. Appl. No. 14/727,517, Office Action Summary, dated Aug. 25, 2017, pp. 1-13.
U.S. Appl. No. 14/727,517, Office Action Summary, dated Jun. 21, 2017, pp. 1-24.

(Continued)

*Primary Examiner* — Jack Chiang
*Assistant Examiner* — Aric Lin
(74) *Attorney, Agent, or Firm* — Kunzler Bean & Adamson

(57) ABSTRACT

For generating path execution times, a method encodes a logic design as a linear array that includes a plurality of logic states. Each logic state includes one or more binary output variables, one or more binary input variables, one or more minterms of the one or more binary input variables, one or more maxterms of the one or more minterms, one or more present state values, and one or more next state values. The method iteratively generates a path execution time for each path between a start state and an end state. The method further generates a maximum path execution time between the start state and the end state as a greatest sum of all path execution times between the start state and the end state.

20 Claims, 26 Drawing Sheets

(56) References Cited

U.S. PATENT DOCUMENTS

| | | |
|---|---|---|
| 9,590,858 B2 | 3/2017 | McFarland |
| 2001/0044708 A1 | 11/2001 | Talwar et al. |
| 2006/0095824 A1 | 5/2006 | McGrath |
| 2007/0011113 A1 | 1/2007 | Mosleh et al. |
| 2007/0118339 A1 | 5/2007 | Moon |
| 2009/0204931 A1 | 8/2009 | Lim et al. |
| 2010/0229132 A1 | 9/2010 | Gu et al. |
| 2013/0019215 A1 | 1/2013 | Swann |
| 2013/0125104 A1 | 5/2013 | Valluri et al. |
| 2014/0085979 A1 | 3/2014 | Kono |
| 2016/0350087 A1 | 12/2016 | McFarland |
| 2016/0350447 A1 | 12/2016 | McFarland |
| 2016/0350448 A1 | 12/2016 | McFarland |
| 2016/0350449 A1 | 12/2016 | McFarland |
| 2016/0350450 A1 | 12/2016 | McFarland |
| 2016/0350668 A1 | 12/2016 | McFarland |
| 2018/0253513 A1 | 9/2018 | McFarland |
| 2018/0300112 A1 | 10/2018 | McFarland |
| 2018/0330024 A1 | 11/2018 | McFarland |
| 2018/0330025 A1 | 11/2018 | McFarland |
| 2018/0330026 A1 | 11/2018 | McFarland |
| 2019/0384583 A1 | 12/2019 | McFarland |

OTHER PUBLICATIONS

U.S. Appl. No. 14/727,544, Office Action Summary, dated Aug. 10, 2017, pp. 1-44.

U.S. Appl. No. 14/727,580, Office Action Summary, dated Aug. 10, 2017, pp. 1-28.

U.S. Appl. No. 14/727,598, Office Action Summary, dated Aug. 10, 2018, pp. 1-38.

U.S. Appl. No. 14/727,530, Office Action Summary, dated Oct. 2, 2017, pp. 1-34.

U.S. Appl. No. 14/727,555, Office Action Summary, dated Nov. 2, 2017, pp. 1-12.

U.S. Appl. No. 14/727,530, Office Action Summary, dated Feb. 9, 2018, pp. 1-21.

U.S. Appl. No. 14/727,517, Office Action Summary, dated Feb. 8, 2018, pp. 1-23.

U.S. Appl. No. 14/727,544, Office Action Summary, dated Feb. 8, 2018, pp. 1-21.

U.S. Appl. No. 14/727,580, Office Action Summary, dated Feb. 8, 2018, pp. 1-20.

U.S. Appl. No. 14/727,598, Office Action Summary, dated Feb. 8, 2018, pp. 1-21.

U.S. Appl. No. 14/727,555, Office Action Summary, dated Mar. 22, 2018, pp. 1-15.

140b

If (Condition_01) { ⟵ 172

174 { Computational_Statement_01;
Computational_Statement_02;
} else { ⟵ 172

Switch (Condition_02)

Case 'Condition_02' :
174 { Computational_Statement_03;
Computation_Statement_04;
Break;

Case 'Condition_02' : ⟵ 172
174 { Computational_Statement_05;
Computational_Statement_06;
Break; }

| Logic Transformation ID |
| 155 |
| Binary Output Variables |
| 225 |
| Next State Values |
| 230 |
| Input Data |
| 160 |
| Input Data |
| 160 |
| Input Data |
| 160 |

160

| Input ID |
| 165 |
| Binary Input Variable |
| 215 |
| Binary Input Variable |
| 215 |
| Binary Input Variable |
| 215 |

205 

```
              ┌─────────────────┐
              │  Logic State ID │
              │       210       │
              └─────────────────┘

┌──────────────┐        ┌──────────────────────┬─────────────┐
    │   Maxterms   │        │ Binary Input Variable│  Not Logic  │
    │     235      │        │         215          │     340     │
    ├──────────────┤        ├──────────────────────┼─────────────┤
    │   Maxterms   │        │ Binary Input Variable│  Not Logic  │
    │     235      │        │         215          │     340     │
    └──────────────┘        └──────────────────────┴─────────────┘
          •                           •                   •
          •                           •                   •
          •                           •                   •
    ┌──────────────┐        ┌──────────────────────┬─────────────┐
    │   Maxterms   │        │ Binary Input Variable│  Not Logic  │
    │     235      │        │         215          │     340     │
    └──────────────┘        └──────────────────────┴─────────────┘

┌──────────────┐        ┌──────────────────────┐
    │   Minterms   │        │ Binary Output Variable│
    │     240      │        │         225          │
    ├──────────────┤        ├──────────────────────┤
    │   Minterms   │        │ Binary Output Variable│
    │     240      │        │         225          │
    └──────────────┘        └──────────────────────┘
          •                           •
          •                           •
    ┌──────────────┐        ┌──────────────────────┐
    │   Minterms   │        │ Binary Output Variable│
    │     240      │        │         225          │
    └──────────────┘        └──────────────────────┘

┌──────────────────┐    ┌──────────────────┐
    │ Present State Value│    │ Next State Value │
    │        220       │    │       230        │
    ├──────────────────┤    ├──────────────────┤
    │ Present State Value│    │ Next State Value │
    │        220       │    │       230        │
    └──────────────────┘    └──────────────────┘
          •                           •
          •                           •
    ┌──────────────────┐    ┌──────────────────┐
    │ Present State Value│    │ Next State Value │
    │        220       │    │       230        │
    └──────────────────┘    └──────────────────┘

┌──────────────────────┐
    │ State Transitions Value│
    │         343          │
    └──────────────────────┘
```

| Logic Element ID |
| 450 |
| Assertion Indicator |
| 295 |
| Assertion Value |
| 290 |

175

| Connection ID |
| 255 |
| Source Field |
| 260 |
| Destination Field |
| 265 |
| Field Assertion Indicator Data |
| 170 |

GENERATING PATH EXECUTION TIMES

CROSS-REFERENCE TO RELATED APPLICATIONS

This is a continuation-in-part application of and claims priority to U.S. patent application Ser. No. 14/727,517 entitled "GENERATING PATH EXECUTION TIMES" and filed on Jun. 1, 2015 for M. David McFarland, which is incorporated herein by reference.

FIELD

The subject matter disclosed herein relates to path execution times and more particularly relates to generating path execution times.

BACKGROUND

Description of the Related Art

It is often desirable to generate a path execution time for logic elements and logic element relationships of a logic design.

BRIEF SUMMARY

A method for generating path execution times is disclosed. The method encodes a logic design as a linear array that includes a plurality of logic states. Each logic state includes one or more binary output variables, one or more binary input variables, one or more minterms of the one or more binary input variables, one or more maxterms of the one or more minterms, one or more present state values, and one or more next state values. The method iteratively generates a path execution time for each path between a start state and an end state. An execution time for a given state transition of a given path is not added to the path execution time in response to state transitions for a given predecessor logic state exceeding a transition threshold. The method further generates a maximum path execution time between the start state and the end state as a greatest sum of all path execution times between the start state and the end state. A program product and apparatus also perform the functions of the method.

BRIEF DESCRIPTION OF THE DRAWINGS

A more particular description of the embodiments briefly described above will be rendered by reference to specific embodiments that are illustrated in the appended drawings. Understanding that these drawings depict only some embodiments and are not therefore to be considered to be limiting of scope, the embodiments will be described and explained with additional specificity and detail through the use of the accompanying drawings, in which:

FIG. 1C is a text diagram illustrating one embodiment of a source code logic design;

FIG. 2F is a schematic block diagram illustrating one embodiment of a logic state;

DETAILED DESCRIPTION

Figure 1A:
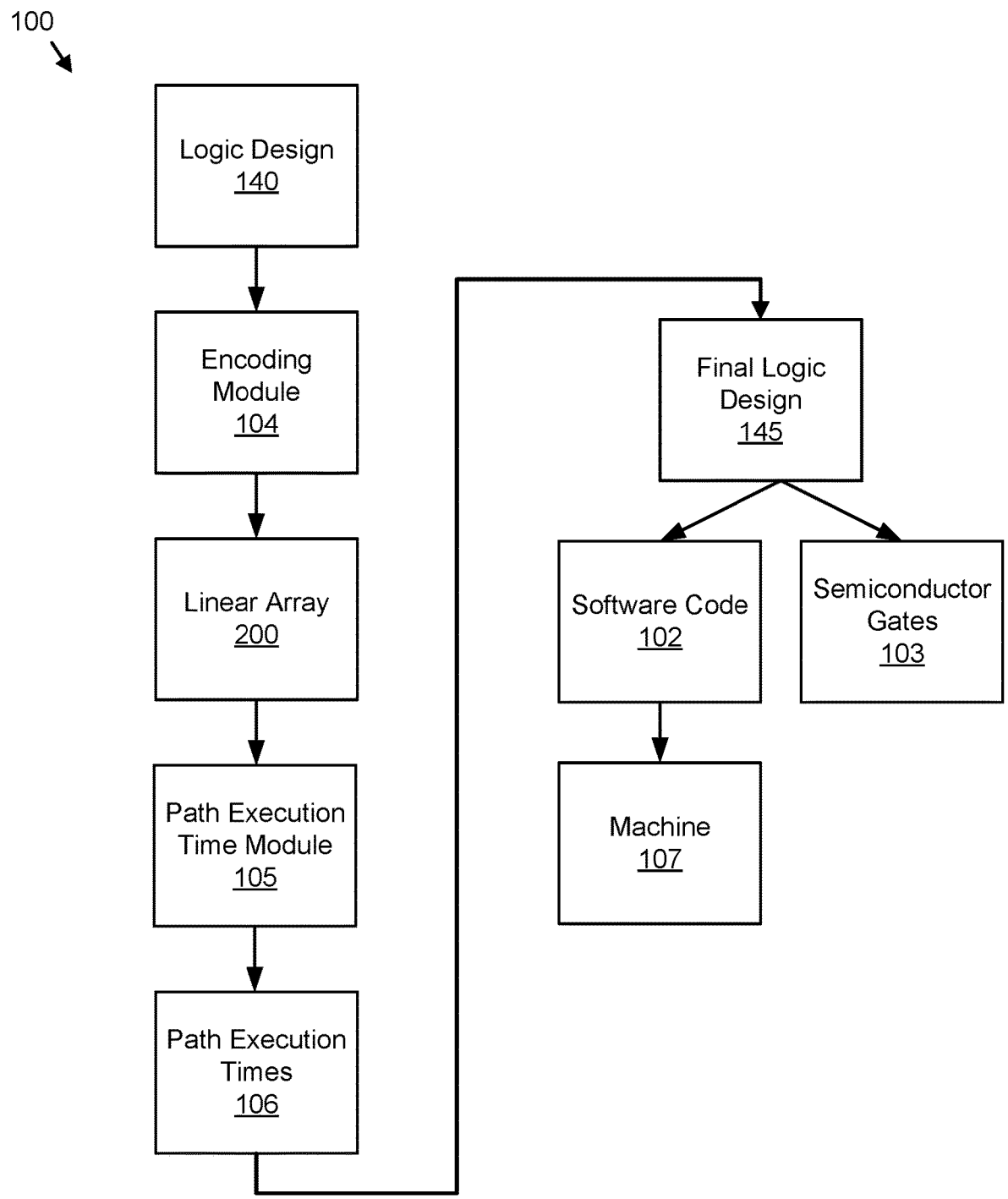
FIG. 1A is a schematic block diagram illustrating one embodiment of a path execution time generation process.

As will be appreciated by one skilled in the art, aspects of the embodiments may be embodied as a system, method or program product. Accordingly, embodiments may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, embodiments may take the form of a program product embodied in one or more computer readable storage medium storing machine readable code, computer readable code, and/or program code, referred hereafter as code. The computer readable storage medium may be tangible, non-transitory, and/or non-transmission. The computer readable storage medium may not embody signals. In a certain embodiment, the storage devices only employ signals for accessing code.

The computer readable storage medium may be a storage device storing the code. The storage device may be, for example, but not limited to, an electronic, magnetic, optical, electromagnetic, infrared, holographic, micromechanical, or semiconductor system, apparatus, or device, or any suitable combination of the foregoing.

More specific examples (a non-exhaustive list) of the storage device would include the following: an electrical connection having one or more wires, a portable computer diskette, a hard disk, a random access memory (RAM), a read-only memory (ROM), an erasable programmable read-only memory (EPROM or Flash memory), a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

Code for carrying out operations for embodiments may be written in any combination of one or more programming languages including an object oriented programming language such as Ada, Python, Ruby, Java, Smalltalk, C++, or the like, and conventional procedural programming languages, such as the "C" programming language, SQL, relay ladder logic, or the like, and/or machine languages such as assembly languages. The code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Reference throughout this specification to "one embodiment," "an embodiment," or similar language means that a particular feature, structure, or characteristic described in connection with the embodiment is included in at least one embodiment. Thus, appearances of the phrases "in one embodiment," "in an embodiment," and similar language throughout this specification may, but do not necessarily, all refer to the same embodiment, but mean "one or more but not all embodiments" unless expressly specified otherwise. The terms "including," "comprising," "having," and variations thereof mean "including but not limited to," unless expressly specified otherwise. An enumerated listing of items does not imply that any or all of the items are mutually exclusive, unless expressly specified otherwise. The terms "a," "an," and "the" also refer to "one or more" unless expressly specified otherwise.

Furthermore, the described features, structures, or characteristics of the embodiments may be combined in any suitable manner. In the following description, numerous specific details are provided, such as examples of programming, software modules, user selections, network transactions, database queries, database structures, hardware modules, hardware circuits, hardware chips, etc., to provide a thorough understanding of embodiments. One skilled in the relevant art will recognize, however, that embodiments may be practiced without one or more of the specific details, or with other methods, components, materials, and so forth. In other instances, well-known structures, materials, or operations are not shown or described in detail to avoid obscuring aspects of an embodiment.

Aspects of the embodiments are described below with reference to schematic flowchart diagrams and/or schematic block diagrams of methods, apparatuses, systems, and program products according to embodiments. It will be understood that each block of the schematic flowchart diagrams and/or schematic block diagrams, and combinations of blocks in the schematic flowchart diagrams and/or schematic block diagrams, can be implemented by code. These code may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the schematic flowchart diagrams and/or schematic block diagrams block or blocks.

The code may also be stored in a storage device that can direct a computer, other programmable data processing apparatus, or other devices to function in a particular manner, such that the instructions stored in the storage device produce an article of manufacture including instructions which implement the function/act specified in the schematic flowchart diagrams and/or schematic block diagrams block or blocks.

The code may also be loaded onto a computer, other programmable data processing apparatus, or other devices to cause a series of operational steps to be performed on the computer, other programmable apparatus or other devices to produce a computer implemented process such that the code which execute on the computer or other programmable apparatus provide processes for implementing the functions/acts specified in the flowchart and/or block diagram block or blocks.

The schematic flowchart diagrams and/or schematic block diagrams in the Figures illustrate the architecture, functionality, and operation of possible implementations of apparatuses, systems, methods and program products according to various embodiments. In this regard, each block in the schematic flowchart diagrams and/or schematic block diagrams may represent a module, segment, or portion of code, which comprises one or more executable instructions of the code for implementing the specified logical function(s).

It should also be noted that, in some alternative implementations, the functions noted in the block may occur out of the order noted in the Figures. For example, two blocks shown in succession may, in fact, be executed substantially concurrently, or the blocks may sometimes be executed in the reverse order, depending upon the functionality involved. Other steps and methods may be conceived that are equivalent in function, logic, or effect to one or more blocks, or portions thereof, of the illustrated Figures.

Although various arrow types and line types may be employed in the flowchart and/or block diagrams, they are understood not to limit the scope of the corresponding embodiments. Indeed, some arrows or other connectors may be used to indicate only the logical flow of the depicted embodiment. For instance, an arrow may indicate a waiting or monitoring period of unspecified duration between enumerated steps of the depicted embodiment. It will also be noted that each block of the block diagrams and/or flowchart diagrams, and combinations of blocks in the block diagrams and/or flowchart diagrams, can be implemented by special purpose hardware-based systems that perform the specified functions or acts, or combinations of special purpose hardware and code.

The description of elements in each figure may refer to elements of proceeding figures. Like numbers refer to like elements in all figures, including alternate embodiments of like elements.

FIG. 1A is a schematic block diagram illustrating one embodiment of a path execution time generation process 100. In the depicted embodiment, the encoding module 104 encodes an initial logic design 140 into a linear array 200. The logic design 140 may describe logical operations that are implemented in hardware, implemented in software, implemented as abstract logic, or combinations thereof.

The logic design 140 typically specifies a plurality of inputs, conditions, actions, outputs, states and/or process flows, referred to hereinafter as logic elements. In addition, the logic design 140 specifies some of the interactions between the logic elements.

Unfortunately, describing all of the possible interactions between the logic elements results in the generation an exponential number of logic element relationships, often $2^N$ logic element relationships where N is the number of logic elements. As a result, even for modest logic designs 140, the logic design 140 is intractably complex.

It may be desirable to determine path execution times 106 for one or more logic element relationships. As used herein, a path execution time 106 is a time to complete one or more logic element relationships from receiving inputs and/or entering a start state to generating outputs and/or entering an end state. For example, a user may wish to determine a maximum path execution time for a plurality of logic element relationships. The completion time of the logic element relationships requiring the longest time to complete may be the maximum path execution time. Alternatively, the user may wish to determine a minimum path execution time 106 for the plurality of logic element relationships. The completion time of the logic element relationships requiring the shortest time to complete may be the minimum path execution time 106.

Unfortunately, the complexity of the logic design 140 may make generating the path execution times 106 impractical. The embodiments described herein encode the logic design 140 into the linear array 200 to reduce the complexity for a path execution time module 105 generating the path execution times 106 as will be described hereafter. The path execution times 106 may be used to select routing paths for a final logic design 145.

In one embodiment, the final logic design 145 is implemented in software code 102. The software code 102 may implement the Boolean logic of the final logic design 145. The software code 102 may be compiled and/or executed on a machine 107 such as a computer or controller. In addition, the final logic design 145 may be fabricated in semiconductor gates 103. The semiconductor gates 103 may implement the Boolean logic of the final logic design 145.

Figure 1B:
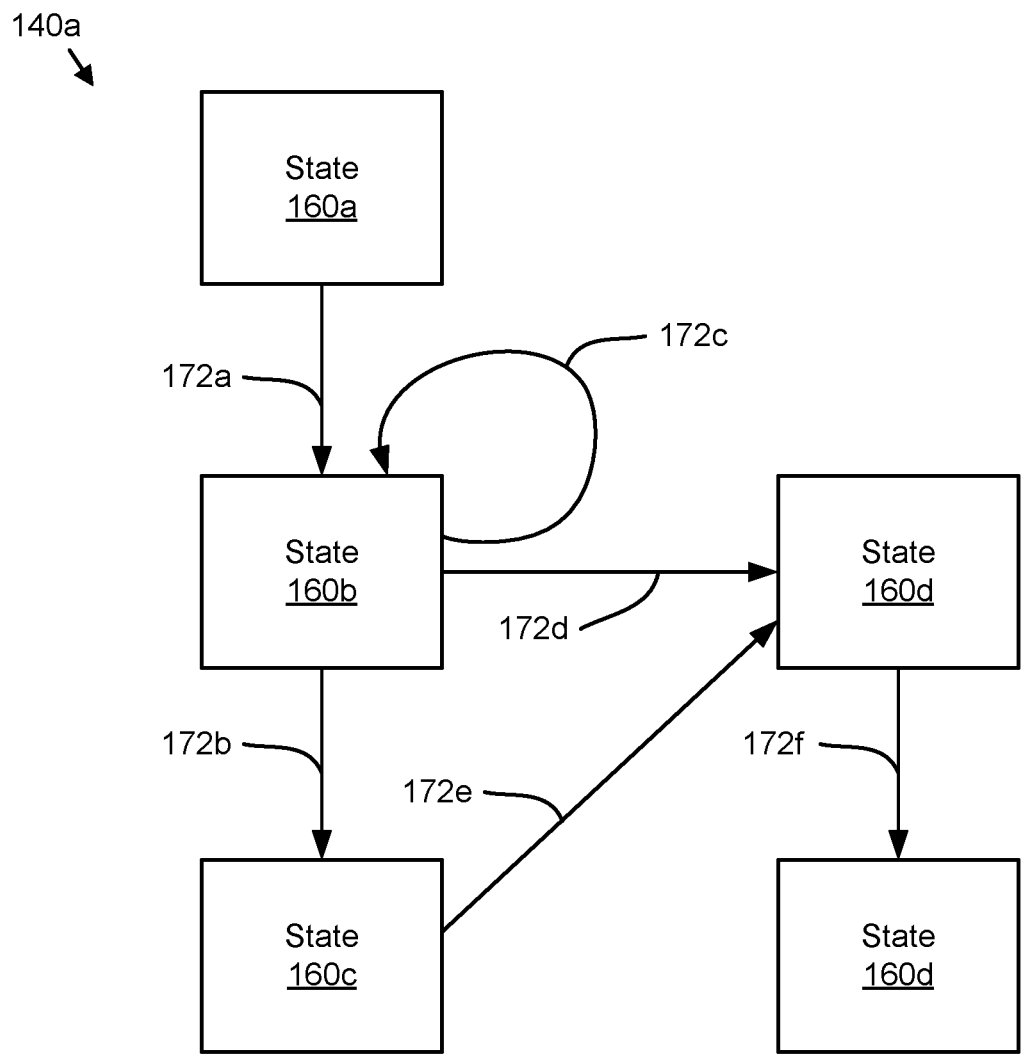
FIG. 1B is a schematic block diagram illustrating one embodiment of a state machine logic design.

FIG. 1B is a schematic block diagram illustrating one embodiment of a state machine logic design 140a. The state machine logic design 140a includes a plurality of states 160 and a plurality of conditional logic 172. Each state 160 may define one or more actions that are taken and/or actions that are not taken. In one embodiment, the conditional logic 172 specifies when to transition from state 160 to state 160.

FIG. 1C is a text diagram illustrating one embodiment of a source code logic design 140b. The source code logic design 140b includes conditional logic 172 that defines when various actions 174 are taken. In the depicted embodiment, the actions 174 are computational statements. The source code logic design 140b may be compiled to generate instructions for a processor or the like.

Figure 1D:
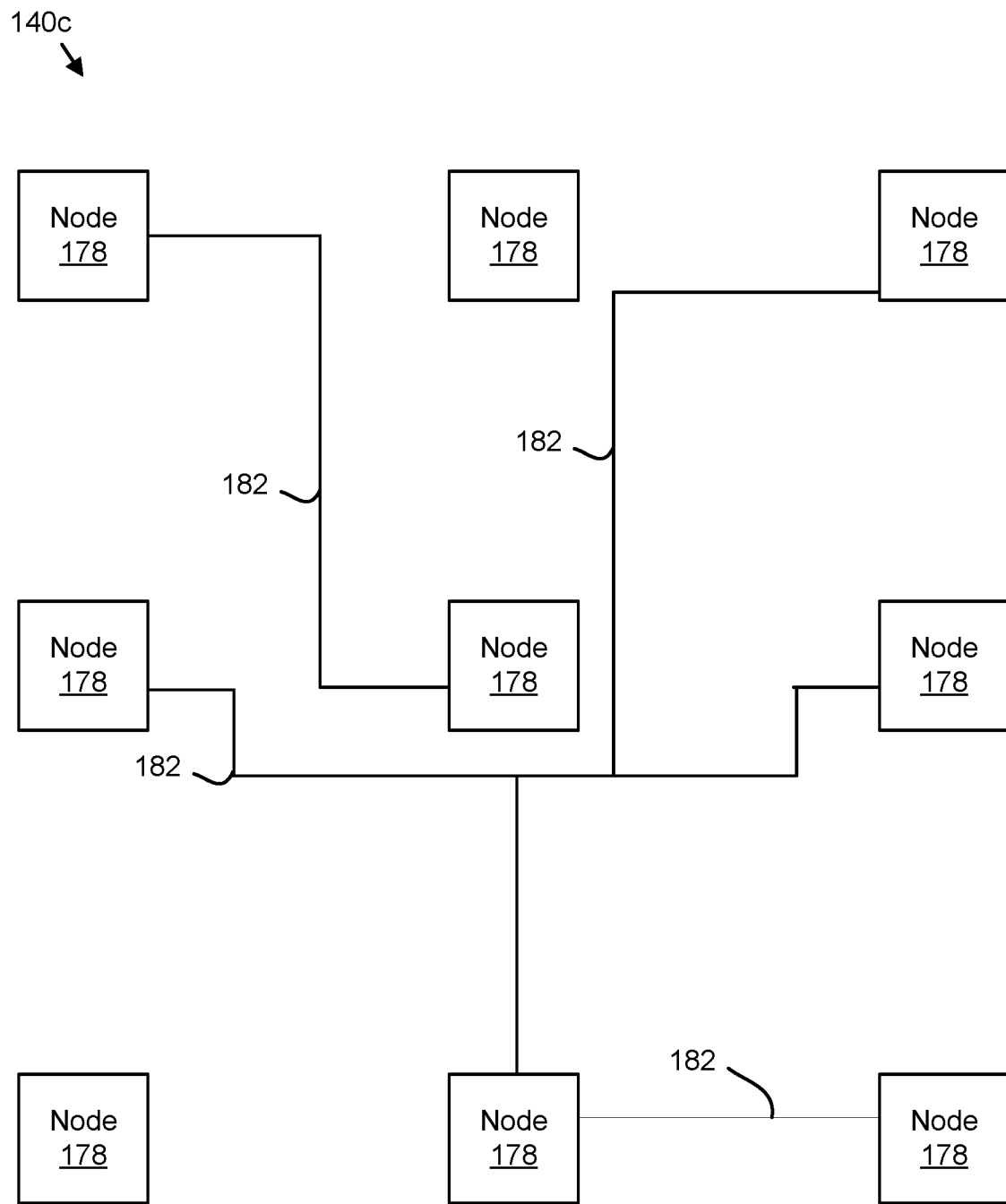
FIG. 1D is a schematic block diagram illustrating one embodiment of a net list logic design.

FIG. 1D is a schematic block diagram illustrating one embodiment of a net list logic design 140c. The net list logic design 140c defines a plurality of nodes 178. Functions of each node 178 are connected by paths 182. The paths 182 may include one or more programmable switches and one or more programmable buses.

In one embodiment, the paths 182 define the net list logic design 140c by defining the relationships between inputs, states, and outputs. The relationships may define conditional logic and actions that are performed in response to the conditional logic. In addition, the net list logic design 140c may include code that is executed by a processor and/or sequencer on a node 178. The logic design 140 may be the combination of the code for the nodes 178 and the organization of the paths 182.

Figure 1E:
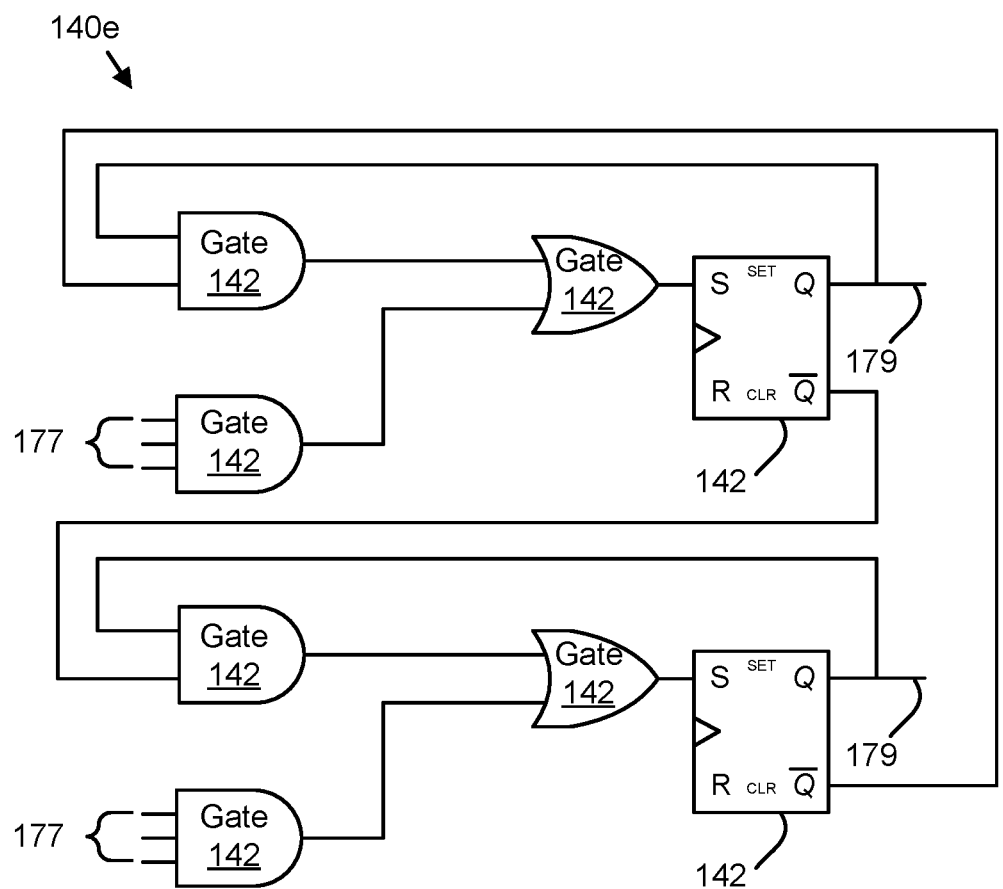
FIG. 1E is a schematic block diagram illustrating one embodiment of a combinatorial logic design.

FIG. 1E is a schematic block diagram illustrating one embodiment of a combinatorial logic design 140e. The combinatorial logic design 140e uses one or more logic gates 142 to generate binary outputs 179 from binary inputs 177.

Figure 1F:
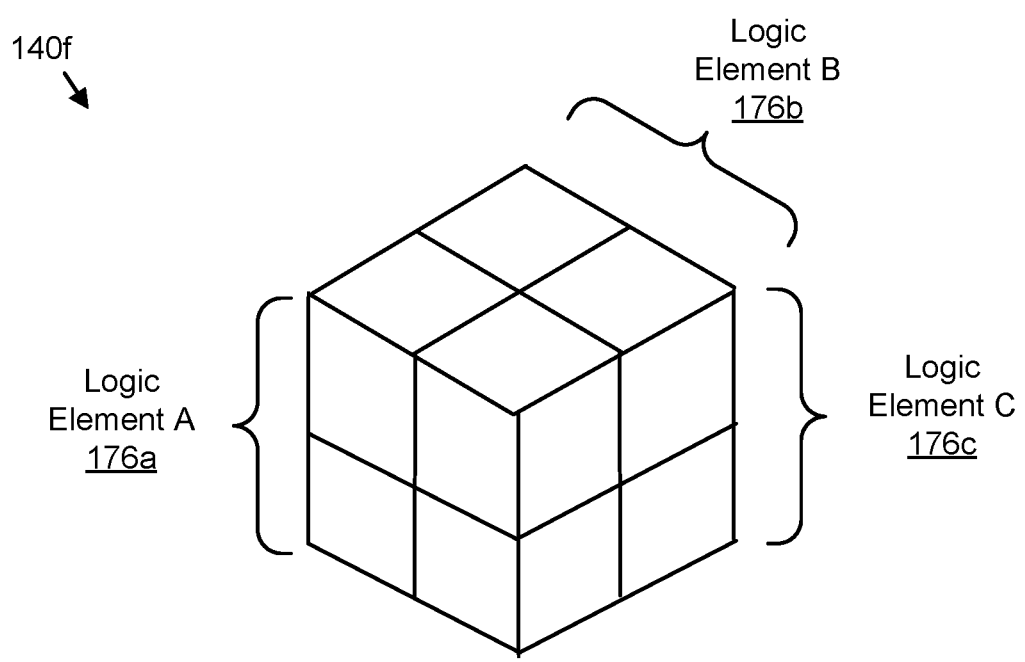
FIG. 1F is a drawing illustrating one embodiment of a multidimensional logical array.

FIG. 1F is a drawing illustrating one embodiment of a multidimensional logical array logic design 140f. For simplicity, the multidimensional logical array logic design 140d is shown for three logic elements 176. As shown, the multidimensional logic array logic design 140f for only three logic elements 176 results in $2^N$ or 8 logic element relationships. For even modest logic designs 140, the number of logic element relationships quickly becomes intractable. The embodiments described herein encode logic designs 140 such as those illustrated FIGS. 1B-E into the linear array 200. The linear array 200 may be examined to identify and define undefined logic element relationships as will be described hereafter.

Figure 2A:
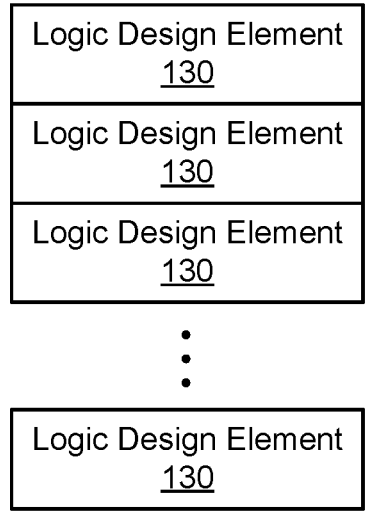
FIG. 2A is a schematic block diagram illustrating one embodiment of a logic design.

FIG. 2A is a schematic block diagram illustrating one embodiment of a logic design 140. The logic design 140 may be organized as a data structure in a memory. The logic design 140 includes a plurality of logic design elements 130. Each logic design element 130 may include one or more logic elements 176 and/or one or more logic element relationships.

The logic design 140 maybe organized as a flat file comprising source code, Boolean descriptions, logical relationships, state relationships, and the like. Each logic design element 130 may be a line or other logical division of the file. Alternatively, the logic design 140 may be organized as a net list that specifies one or more nodes 178 and one or more paths 182 between the nodes 178. Each logical design element 130 may define a path 182. In one embodiment, the logical design 140 includes data structures that define functions performed at each node 178.

In one embodiment, the logic design elements 130 define logic gates 142, binary outputs 179, and/or binary inputs 177. Alternatively, the logic design elements 130 may define states 160, conditional logic 172, actions 174, or combinations thereof.

Figure 2B:
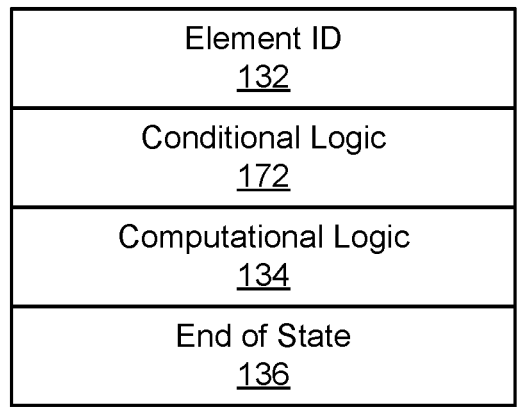
FIG. 2B is a schematic block diagram illustrating one embodiment of a logic design element.

FIG. 2B is a schematic block diagram illustrating one embodiment of a logic design element 130. The logic design element 130 may be organized as a data structure in a memory. Each logic design element 130 may be parsed from the logic design 140. In the depicted embodiment, the logic design element 130 includes an input identifier 132, conditional logic 172, computational logic 134, and an end of state 136.

The element identifier 132 may uniquely identify the logic design element 130. The element identifier 132 includes a file name. In addition, the element identifier 132 may comprise a range of line numbers for a text file, a data structure reference number, or combinations thereof.

The conditional logic 172 may define conditions that must be satisfied in order to execute the computational logic 134. In addition, the conditional logic 172 may define an element identifier 132 if the conditions are not satisfied in order to execute the computational logic 134. In one embodiment, the conditional logic 172 is always performed if another logic design element 130 branches to the current element identifier 132. In one embodiment, the conditional logic 172 includes one or more of nodes 178, paths 182, logic gates 142, binary outputs 179, binary inputs 177, states 160, and actions 174.

The computational logic 134 may specify actions 174 that are performed if the conditional logic 172 is satisfied. The actions 174 may include one or more computational statements. Alternatively, the actions 174 may include one or more of nodes 178, paths 182, logic gates 142, binary outputs 179, binary inputs 177, and states 160. In addition, the computational logic 134 may assert and/or deassert one or more binary output variables and/or one or more next state values. The end of state 136 may indicate an end of the conditional logic 172 and the computational logic 134 associated with the element identifier 132.

Figure 2C:
FIG. 2C is a schematic block diagram illustrating one embodiment of a logic transformation.

FIG. 2C is a schematic block diagram illustrating one embodiment of a logic transformation 150. The logic transformation 150 may be generated from the logic design element 130. The logic transformation 150 maybe organized as a data structure in a memory. In the depicted embodiment, the logic transformation 150 includes a logic transformation identifier 155, binary output variables 225, next state values 230, and input data 160.

The binary output variables 225 maybe control signals such as binary outputs 179. In addition, the binary output variables 225 may identify data structures such as numerical values, alphanumeric values, logical values, dates, times, and the like. In one embodiment, the logic design element 130 is parsed to identify each binary output variable 225 from the computational logic 134.

The next state values 230 may define logical states. In one embodiment, the next state values 230 comprise an element identifier 132 for a logic design element 130. In addition, the next state values 230 may include one or more binary state values as will be described hereafter.

The input data 160 may define inputs that generate the binary output variables 225 and the next state values 230. In one embodiment, input data 160 is generated for each binary output variable 225 and each next state value 230.

Figure 2D:
FIG. 2D is a schematic block diagram illustrating one embodiment of input data.

FIG. 2D is a schematic block diagram illustrating one embodiment of input data 160. The input data 160 maybe organized as a data structure in a memory. In the depicted embodiment, the input data 160 includes an input identifier 165 and a plurality of binary input variables 215.

The input identifier 165 may uniquely identify the input data 160. The binary input variables 215 may be control signals such as binary inputs 177. Alternatively, the binary input variables 215 may identify data structures such as numerical values, alphanumeric values, logical values, dates, times, and the like.

Figure 2E:
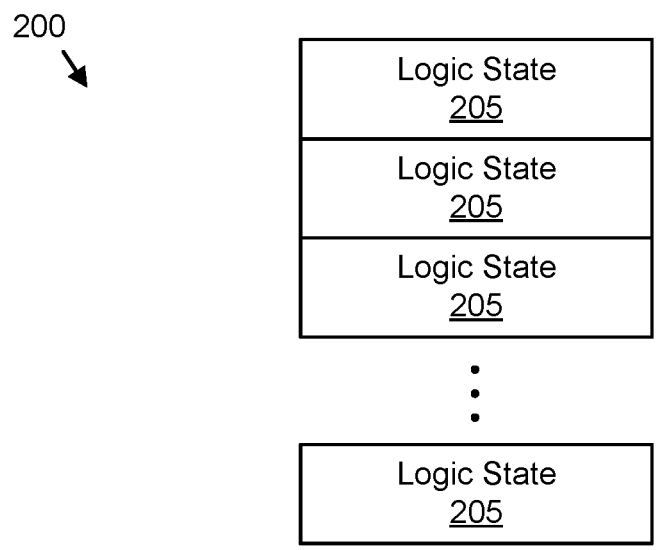
FIG. 2E is a schematic block diagram illustrating one embodiment of a linear array.

FIG. 2E is a schematic block diagram illustrating one embodiment of a linear array 200. The linear array 200 may be generated from the logic transformation 150. The linear array 200 maybe organized as a data structure in a memory. The linear array 200 includes a plurality of logic states 205.

FIG. 2F is a schematic block diagram illustrating one embodiment of a logic state 205. The logic state 205 maybe organized as a data structure in a memory. The logic state 205 includes a logic state identifier 210, one or more binary input variables 215, one or more binary output variables 225, one or more next state values 230, one or more present state values 220, one or more maxterms 235, one or more minterms 240, and a state transitions value 343.

The logic state identifier 210 may uniquely identify the logic state 205. The logic state identifier 210 may include a label, a mnemonic, or the like. In addition, the logic state identifier 210 may include a corresponding logic transformation identifier 155 for the logic transformation 150 that corresponds to the logic state 205.

The binary output variables 225 may include each binary output variable 225 from the logic design 140. Alternatively, the binary output variables 225 may include each binary output variable 225 identified for the corresponding logic transformation 150. In one embodiment, each binary output variable 225 is assigned an identifier such as a label, a logical representation, an index value, or the like.

The binary input variables 215 may include each binary input variable 215 from the logic design 140. In addition, the binary input variables 215 may include each binary input variable 215 identified for the corresponding logic transformation 150. NOT logic 340 may be associated with each binary input variable 215. The NOT logic 340 indicates whether an inverse of the binary input variable 215 is asserted. In one embodiment, each binary input variable 215 is assigned an identifier such as a label, a logical representation, an index value, or the like.

The present state values 220 may be binary values that uniquely define the logic state 205 as a binary value. The present state values 220 may uniquely describe the logic state identifier 210. The present state values 220 for each logic state 205 may be associated with a logic transformation identifier 155. In one embodiment, the present state values 220 may be selected reduce the complexity of the logic design 140. In one embodiment, each present state value 220 is assigned an identifier such as a label, a logical representation, an index value, or the like.

The next state values 230 may define one or more next states that are branched to as a function of the binary input variables 215. The next state values 230 may be a binary encoding of the next state values 230 of the logic transformation 150. In one embodiment, each next state value 230 is assigned an identifier such as a label, a logical representation, an index value, or the like.

Each minterm 240 may be a binary product or logical AND of one or more binary input variables 215 and/or one or more present state values 220. Alternatively, each minterm 240 may be a binary product of one or more maxterms 235. In one embodiment, each minterm 240 is assigned an identifier such as a label, a logical representation, an index value, or the like.

Each maxterm 235 may be a binary sum or logical OR of one or more minterms 240. Alternatively, each maxterm 235 may be a binary sum of one or more binary input variables 215 and/or one or more present state values 220. In one embodiment, each maxterm 235 is assigned an identifier such as a label, a logical representation, an index value, or the like.

The state transitions value 343 may record a number of state transitions that have been traversed from a current logic state 205 to subsequent logic states 205. A state transition transitions active control from the current logic state 205 to a subsequent logic state 205. For example, the current logic state 205 STATE00 may transition active control of a device or computer to subsequent state 205 STATE01.

In one embodiment, the state transitions value 343 is incremented each time a state transition from the current logic state 205 is traversed. Alternatively, the state transitions value 343 records a total number of state transitions from the current logic state 205 to subsequent logic states 205.

The plurality of logic states 205 in the linear array 200 represents the multidimensional array of the logic design 140 in a form that is more easily manipulated and analyzed. As a result, logic element relationships may be identified, analyzed, and resolved as will be described hereafter.

Figure 2G:
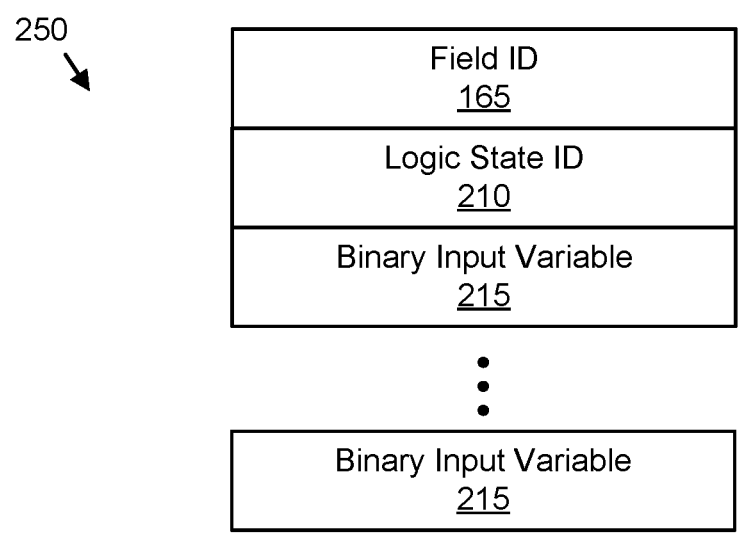
FIG. 2G is a schematic block diagram illustrating one embodiment of field data.

FIG. 2G is a schematic block diagram illustrating one embodiment of field data 250. The field data 250 describes a field in the combination map. The field data 250 maybe organized as a data structure in a memory. In the depicted embodiment, the field data 250 includes a field identifier 165, one or more logic state identifiers 210, and one or more binary input variables 215.

The field identifier 165 may uniquely identify the field in the combination map. The logic state identifier 210 may identify a logic state 205 associated with the field. Each field may represent at least one single logic state 205. The binary input variables 215 may indicate which of the binary input variables 215 for the logic state 205 is associated with the field.

Figure 2H:
FIG. 2H is a schematic block diagram illustrating one embodiment of assertion indicator data.

FIG. 2H is a schematic block diagram illustrating one embodiment of assertion indicator data 170. The assertion indicator data 170 may indicate whether a logic element 176 is asserted. The assertion indicator data 170 may be organized as a data structure in a memory. In the depicted embodiment, the assertion indicator data 170 includes a logic element identifier 450, an assertion indicator 295, and an assertion value 290.

The logic element identifier 450 associates the assertion indicator data 170 with a logic element 176. The assertion value 290 specifies whether binary input variables 215, present state values 220, minterms 240, maxterms 235, binary output variables 225, next state values 230, state values 315 and other logic elements 176 are asserted, deasserted, a DON'T CARE, undefined, or unknown.

In one embodiment, the assertion indicator 295 is of an indicator type selected from the group consisting of a color, a label, an arrow, an icon, hashing, and motion. For example, the indicator type may be a color with blue indicating that a field is asserted and read indicating that the field is deasserted.

Figure 2I:
FIG. 2I is a schematic block diagram illustrating one embodiment of connection data.

FIG. 2I is a schematic block diagram illustrating one embodiment of relationship arrow data 175. The relationship arrow data 175 may define a relationship arrow between fields of the combination map as will be described hereafter. The relationship arrow data 175 maybe organized as a data structure in a memory. In the depicted embodiment, the relationship arrow data 175 includes a connection identifier 255, a source field 260, a destination field 265, and the assertion indicator data 170.

The connection identifier 255 uniquely identifies a connection between the source field 260 and the destination field 265. The connection identifier 255 may be a label, an index, or the like.

The source field 260 may identify a first field that defines a first logical element relationship. The destination field 265 may identify one or more second fields that have second logical element relationships that include the first logical element relationship. For example, the source field 260 may define a first binary input variables 215 that are included the minterms 240 of the destination field 265. The destination field 265 may be a combination map. The assertion indicator data 170 may indicate if the source field 260 and/or the connection between the source field 260 and the destination field 265 are asserted.

Figure 2J:
FIG. 2J is a schematic block diagram illustrating one embodiment of logic element data.

FIG. 2J is a schematic block diagram illustrating one embodiment of logic element data 185 for a logic element 176. The logic element data 185 maybe organized as a data structure in memory. In the depicted embodiment, the logic element data 185 includes a logic element identifier 450, a logic element type 455, one or more input identifiers 456, one or more output identifiers 457, a partition identifier 459, an execution time 377, and a package identifier 461.

The logic element identifier 450 may uniquely identify the logic element. The logic element identifier 450 may be a label, an index, or the like.

The logic element type 455 may specify a type such as a binary input variable 215, a binary output variable 225, the minterm 240, a maxterm 235, a present state value 220, a next state value 230, not logic 340, a state transition between logic states 205, and the like. Alternatively, the logic element type 455 may specify a logic state 205, a state 160, a software variable, conditional logic 172, computational logic 134, an action 174, a node 178, a path 182, or the like.

The input identifiers 456 may list the logic element identifiers 450 of inputs such as binary inputs 177 to the logic element. The output identifiers 457 may list the logic element identifiers 450 of logic elements receiving outputs from the logic element.

The partition identifier 459 may specify a partition that the logic element is assigned to. A partition may be a device design, hardware design elements for a device, software design elements for a device, or the like. For example, the partition identifier 459 may specify the logic element 176 is assigned to a software design partition. Alternatively, the partition identifier 459 may specify that the logic element 176 is assigned to a hardware design partition.

The execution time 377 may specify one or more of a minimum time for a state transition, a maximum time for a state transition, an average time for a state transition, a mean time for a state transition, a medium time for a state transition, the simulation generated time for a state transition, or the like.

The package identifier 461 may specify a destination package for the logic element. The destination package may be a defined package or a computational package. The defined package and the computational package may be used to validate the linear array 200.

Figure 3A:
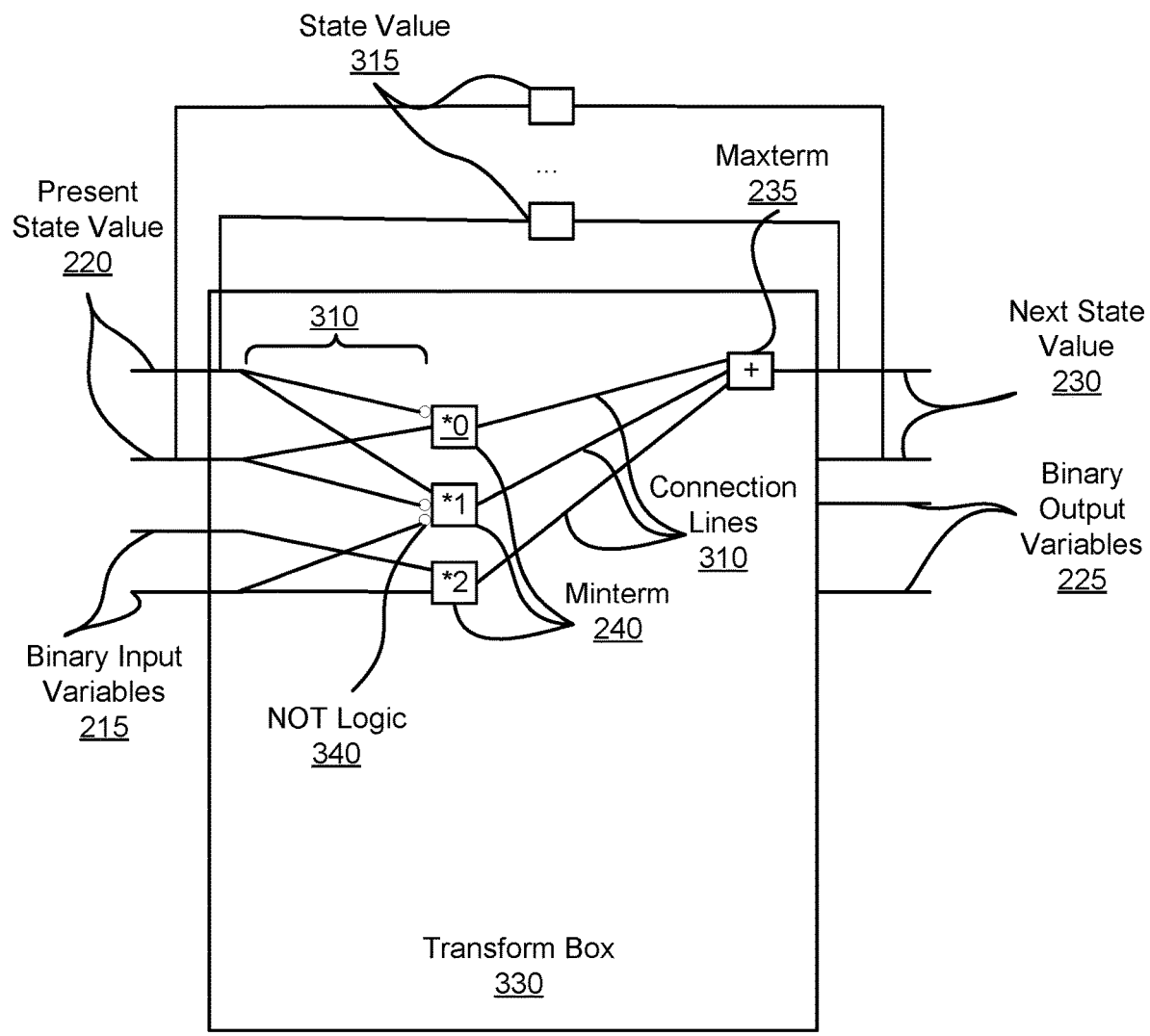
FIG. 3A is a schematic block diagram illustrating one embodiment of a transform box.

FIG. 3A is a schematic block diagram illustrating one embodiment of a transform box 330. The transform box 330 represents one or more logic states 205 as combinatorial logic. The transform box 330 allows undefined logic element relationships to be identified and resolved. Each transform box 330 may be associated with at least one logic state 205 and the field data 250 for the at least one logic state 205. The transform box 330 may be presented as a graphical user interface (GUI) on display. The elements of the transform box 330 may be manipulated by user. In the depicted embodiment, the elements of the transform box 330 include state values 315, the present state values 220, the next state values 230, the binary input variables 215, the NOT logic 340, one or more minterms 240, and one or more maxterms 235. In the depicted embodiment, the transform box 330 shows sum of products logic. Alternatively, the transform box 330 may display product of sums logic.

In one embodiment, only one maxterm 235 is displayed at a given time. Alternatively, each maxterm 235 for the logic state 205 may be displayed at a given time. Each maxterm 235 is represented as a logical sum of one or more minterms 240. Each maxterm 235 defines one or more of a next state value 230 and a binary output variable 225. Alternatively, only one minterm 240 may be displayed for product of sums logic.

Each minterm 240 may be displayed as a function of one or more binary input variables 215 and the NOT logic 340 associated with the binary input variables 215. In addition, each minterm 240 may be displayed as a function of the present state values 220.

The state values 315 may indicate previous next state values 230 that define the present state values 220. The next state values 230 define a next logic state 205. The binary output variables 225 define the actions 174 of the logic state 205.

Connection lines 310 may show the logical relationship of the binary input variables 215 and present state values 220 to minterms 240 and NOT logic 340. In addition, the connection lines 310 may show the logical relationship of the minterms 240 to the maxterms 235. Assertion indicator data 170 may define an assertion value for each connection line 310. A Boolean expression may be derived from the connection lines 310, binary input variables 215, present state values 220, NOT logic 340, minterms 240, and maxterms 235.

In one embodiment, a user may modify a logic state 205 by editing the displayed present state values 220, binary input variables 215, NOT logic 340, minterms 240, maxterms 235, next state values 230, binary output variables 225, and connection lines 310.

Figure 3B:
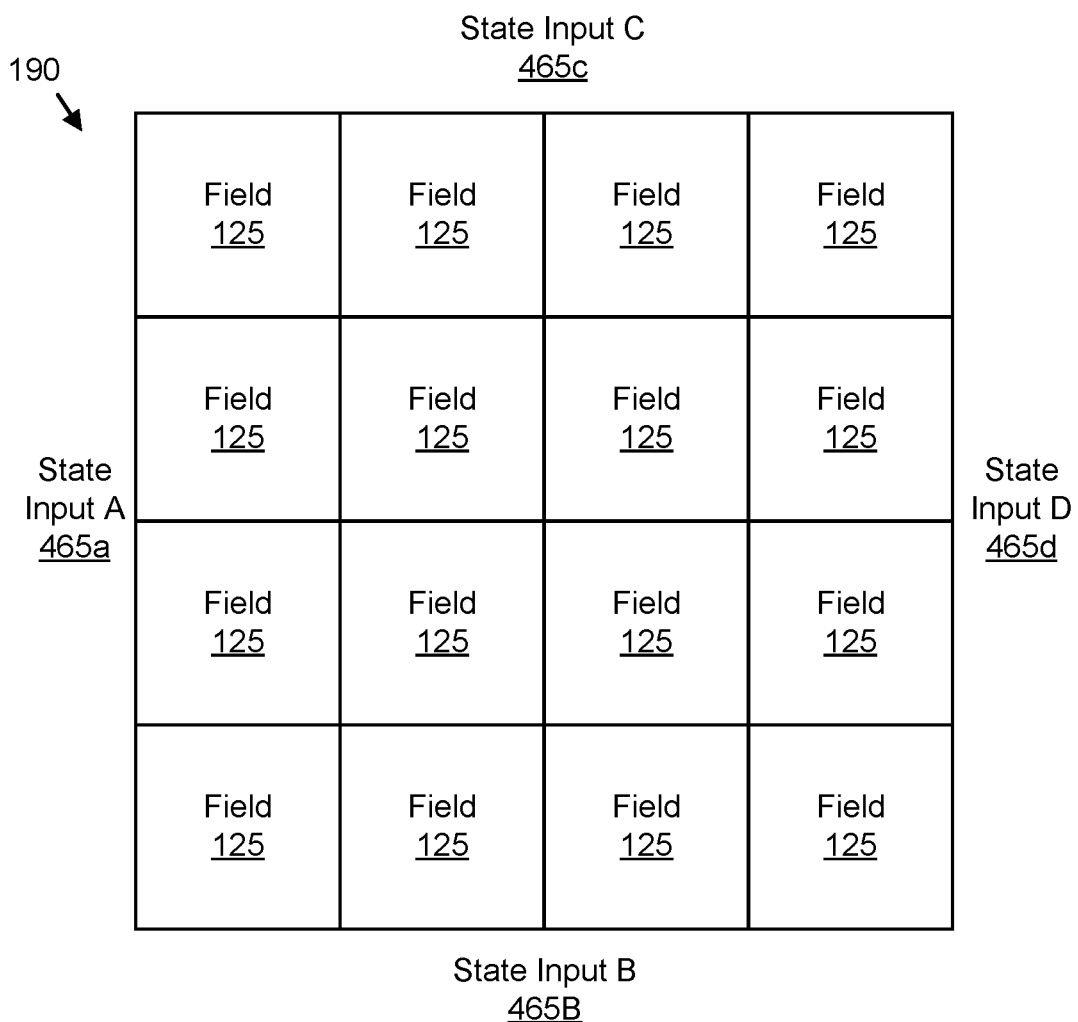
FIG. 3B is a drawing illustrating one embodiment of a combination map.

FIG. 3B is a drawing illustrating one embodiment of a combination map 190. In the depicted embodiment, fields 125 are shown for four state inputs 465. Each state input 465 is one of a binary input variable 215 and a present state value 220. Each field 125 is associated with unique field data 250. Each field 125 may represent a logic state 205. Alternatively, each field 125 may represent a plurality of binary input variables 215 as will be shown in FIG. 3D.

In one embodiment, state inputs 465 are automatically organized into the plurality of fields 125. For example, present state values 220 may be assigned to fields of higher level combination maps 190 while binary input variables 215 may be assigned to lower level combination maps 190. In addition, binary input variables 215 that defined in for a larger number of minterms 235 may be assigned to higher level combination maps 190. In one embodiment, binary input variables 215 that are defined with differing assertion values 290 for a larger number of minterms 235 are assigned to higher level combination maps 190.

Figure 3C:
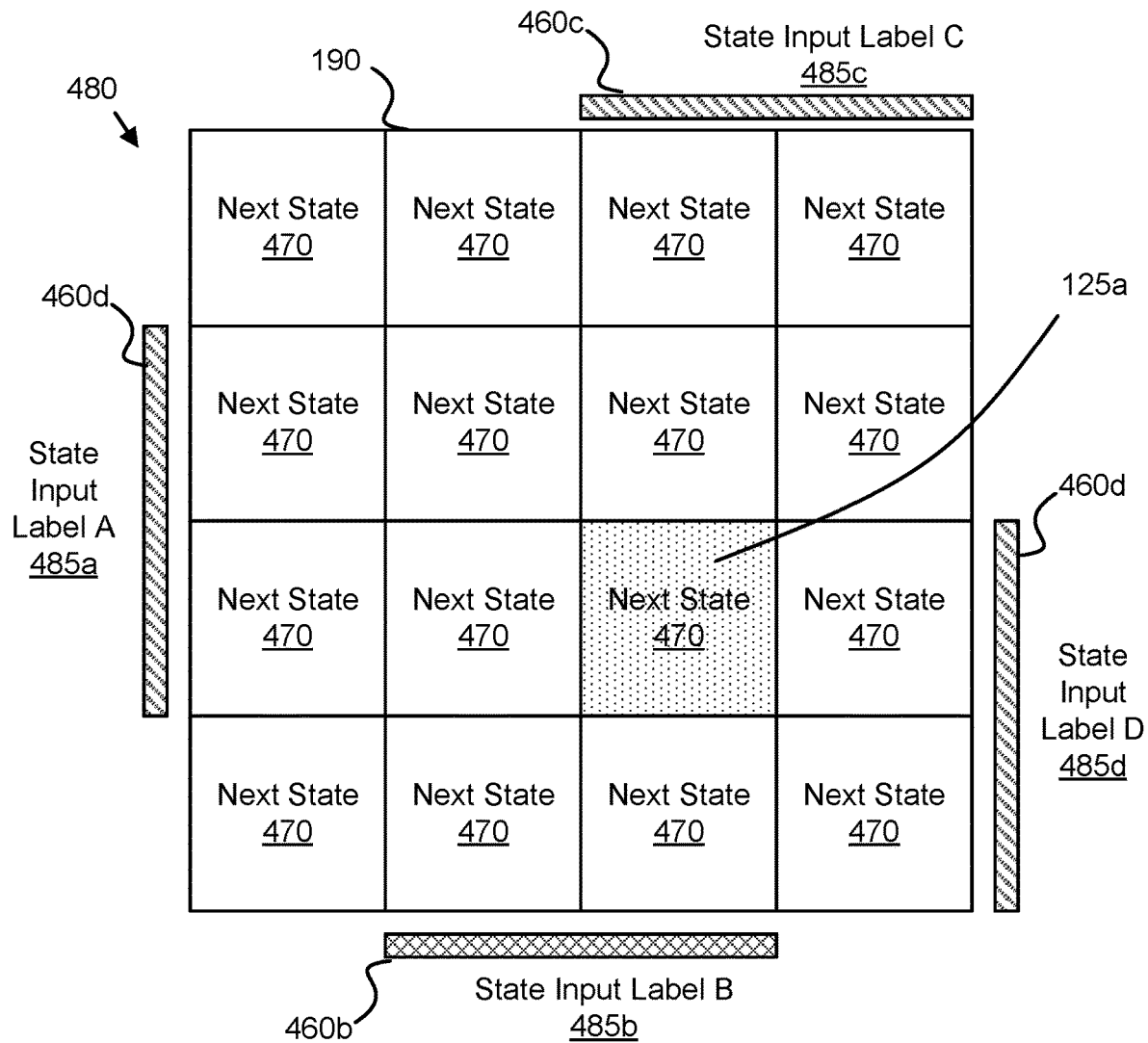
FIG. 3C is a drawing illustrating one embodiment of a combination map display.

FIG. 3C is a drawing illustrating one embodiment of a combination map display 480. A combination map 190 is displayed to the user such as on the display of a computer. State input labels 485 are shown for each state input 465 of FIG. 3B. Assertion bars 460 indicate whether each state input 465 is asserted or deasserted. Each field 125 of FIG. 3B displays a next state 470 if the state inputs 465 for the field 125 are asserted. The next state 470 may be next state values 230, a logic state identifier 210, or combinations thereof. Alternatively, the next state 470 may indicate another combination map 190 with binary input variables 215 that determine if the field 125 is asserted.

If the state inputs 465 indicated by the state input labels 485 are present state values 220, each field 125 may represent a logic state 205. A user may be prompted to enter a logic state identifier 210 for each logic state 205.

In addition, each field 125 may define an assertion value for the one or more binary output variables 225. The user may be prompted to define the assertion value 290 of a binary output variable 225 for each field 125 and/or each logic state 205.

In the depicted embodiment, a first field 125a is defined as asserted as a result of each the state inputs 465 identified by the state input labels 485 being asserted. As a result, upon completion of the logic state 205 defined by the present state values 220, the next state values 230 associated with the next state 470 will be asserted.

Figure 3D:
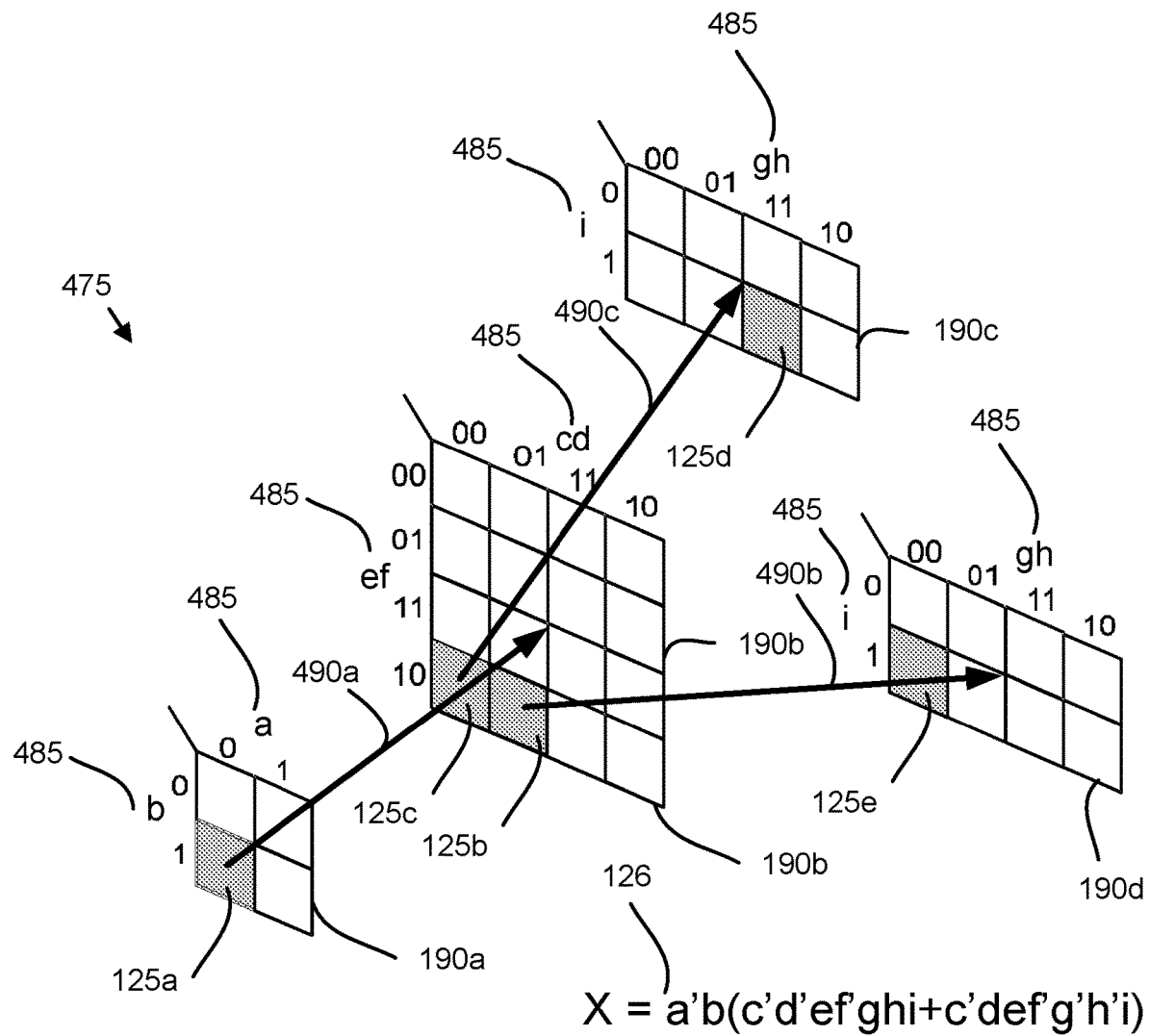
FIG. 3D is a drawing illustrating one embodiment of combination map levels.

FIG. 3D is a drawing illustrating one embodiment of combination map level display 475. A plurality of combination maps 190 are shown as though displayed on the display of the computer. Each field 125 may correspond to a logic state 205, one or more minterms 240, one or more maxterms 240, or combinations thereof.

In one embodiment, each combination map 190 on a lower level, such as combination maps 190b-d, corresponds to only one field 125 on a combination map 190 of an upper level, such as combination map 190a. The state input labels 485 may indicate the state inputs 465 such as present state values 220 and binary input variables 215 that define the fields 125. Assertion values 290 are also indicated for the state inputs 465.

In one embodiment, the fields 125 of the upper level combination maps 190 correspond to logic states 205. For example, each field 125 of the top-level combination map 190a may correspond to a logic state 205. Alternatively, the fields 125 of two or more upper level combination maps 190 may correspond to logic states 125. The state inputs 465 of the upper level combination maps 190 may be present state values 230 that indicate which logic state 205 is active.

A first field 125a of a first combination map 190a may be defined by a second combination map 190b as indicated by a first relationship arrow 490a. Each relationship arrow 490 may connect a field 125 of an upper level combination map 190 to a lower level combination map 190. The first combination map 190a may represent the present state values 220 a and b.

The second combination map 190b may represent the Boolean equation cef'. A second relationship arrow 490b may indicate that a second field 125b of the second combination map 190b is defined by a fourth combination map 190d. The fourth combination map 190d may represent the Boolean equation g'h'i as indicated by asserting a fifth filed 125e. A third relationship arrow 490c may indicate that a third field 125c is defined by a third combination map 190c. The third combination map 190c may represent the Boolean equation ghi as indicated by asserting a fourth field 125d. In the depicted embodiment, the combination map level display 475 represents the Boolean equation 126 X=a'b(c'd'ef'-'ghi+c'def'g'h'i).

The plurality of combination maps 190 forms a multilevel display format. The multilevel display format has a top display level as illustrated by the first combination map 190a and at least one lower display levels as illustrated by the second and third combination maps 190b-c.

Each combination map 190 includes state input labels 485 that identify the state inputs 465 for the combination map 190. Relationship arrows 490 show the logical relationship between a combination map 190 and a field 125. The relationship arrows 490 may be defined by the relationship arrow data 175.

In one embodiment, relationship arrows 490 link a first field 125a with successive combination maps 190 at successive display levels. The relationship arrows 490 indicate a logical relationship between the fields 125.

A combination of first binary input variables 215 and/or present state values 220 for a first field 125a may be identified by selecting the first field 125a of a combination map 190a at first display level. In response to selecting the first field 125a, additional combinations of second binary input variables 215 in a successive combination map 190 that logically define the first field 125a may be identified. The combination map 190 of the second binary input variables 215 may be at a successive display level lower than the first display level.

In one embodiment, combination maps 190 of additional binary input variables 215 that logically define the selected first field 125a are displayed on combination maps 190 at each successive level until the last display level is reached. In one embodiment, the combination maps 190 may be logically collapsed. A binary output variable 225 may be assigned to the combination of all binary input variables 215 on each display level of the combination maps 190 for the selected first field 125a. In addition, the combination of all binary input variables 215 on each display level of the combination maps 190 may be converted into a logical expression 126.

Figure 3E:
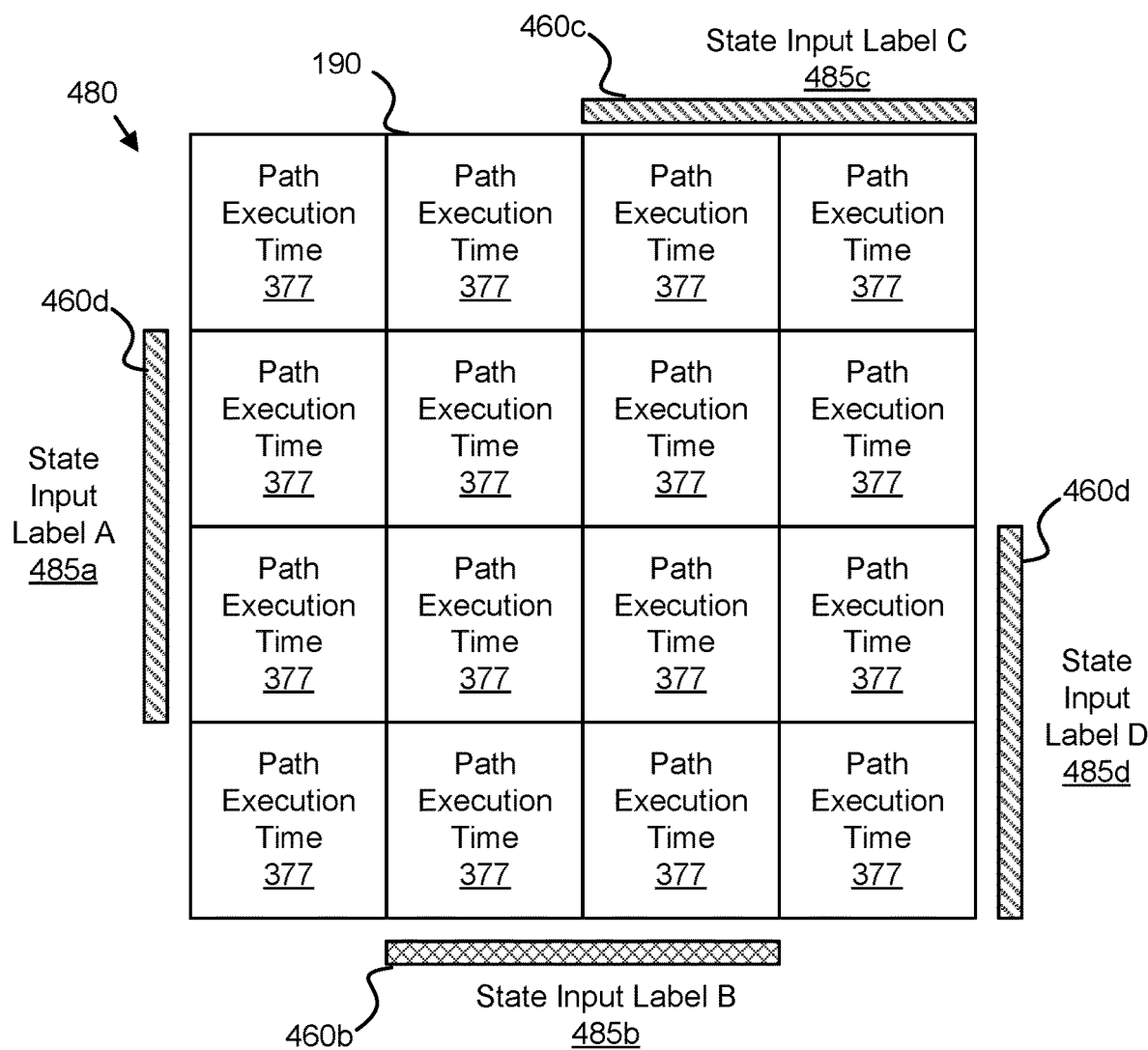
FIG. 3E is a drawing illustrating one embodiment of combination map display with execution times.

FIG. 3E is a drawing illustrating one embodiment of combination map display 480 with path execution times 377. A state transition may be a transition between a given logic state 205 and a subsequent logic state 205. The path execution times 377 may be the sum of the execution times 377 for each state transition along the path. In the depicted embodiment, a combination map 190 is displayed for a user with path execution times 377 shown for each field. The user may specify a path execution time 377 for a field of the combination map 190. For example, the user may specify a minimum path execution time 377, a maximum path execution time 377, or the like.

Alternatively, the user may generate the path execution times 377 for a field by selecting the field. For example, the user may select a first field to generate an estimated minimum path execution time 377, an estimated maximum path execution time 377, or the like for the first field. Similarly, the user may select and generate path execution times 377 for a plurality of fields. As a result, the user may analyze and manipulate the path execution times 377 using the combination map 190.

Figure 3F:
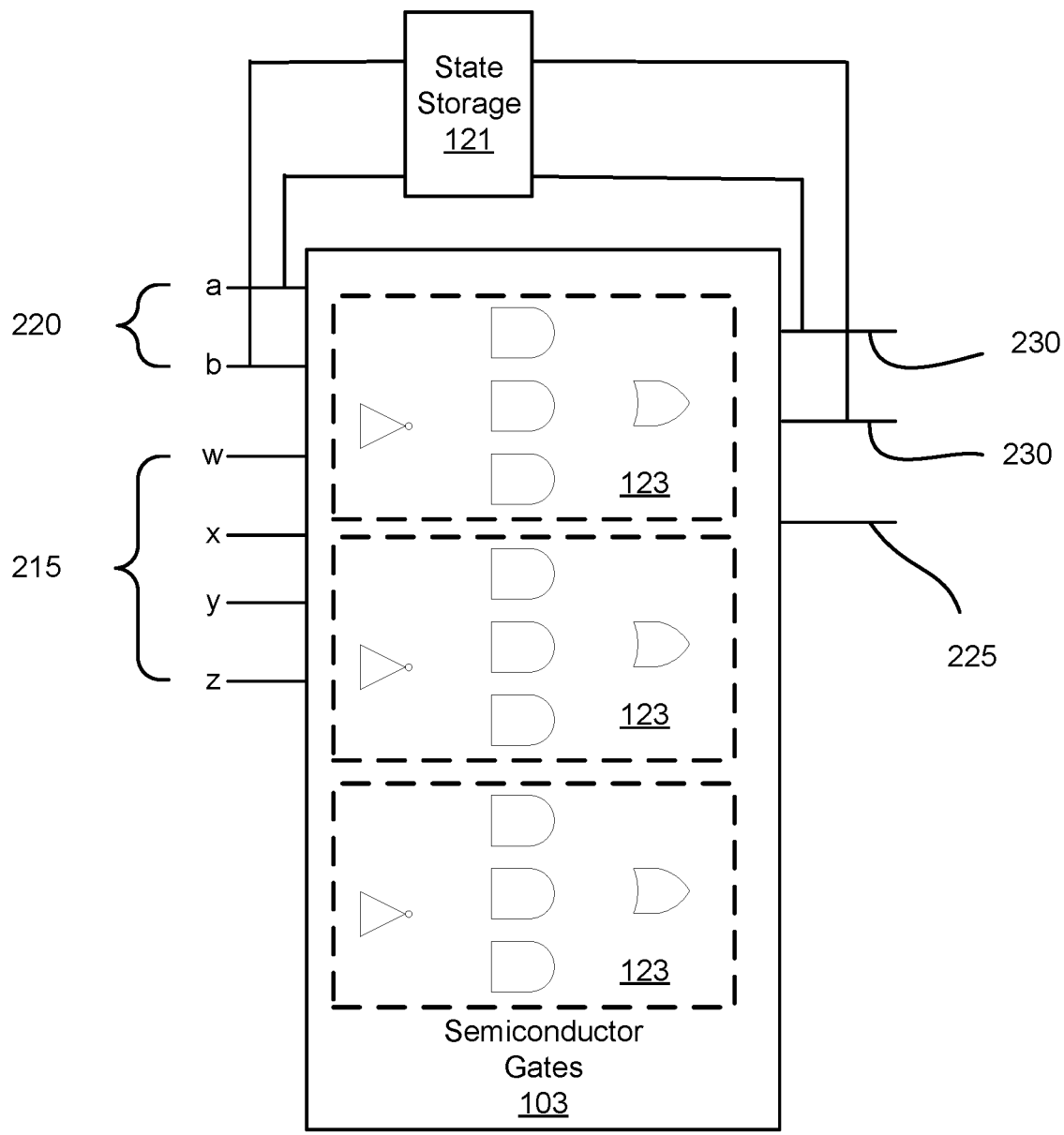
FIG. 3F is a schematic block diagram illustrating one embodiment of semiconductor gates.

FIG. 3F is a schematic block diagram illustrating one embodiment of semiconductor gates 103. The semiconductor gates 103 may be fabricated to implement the final logic design 145. The semiconductor gates 103 receive the present state values 220 and the binary input variables 215 as inputs. The semiconductor gates 103 further generate the next state values 230 and the binary output variables 225. The next state values 230 may be stored in states storage 121. The semiconductor gates 103 may implement the final logic design 145. In one embodiment, the semiconductor gates 103 implement the final logic design 145 with no more than three gate delays.

Figure 4:
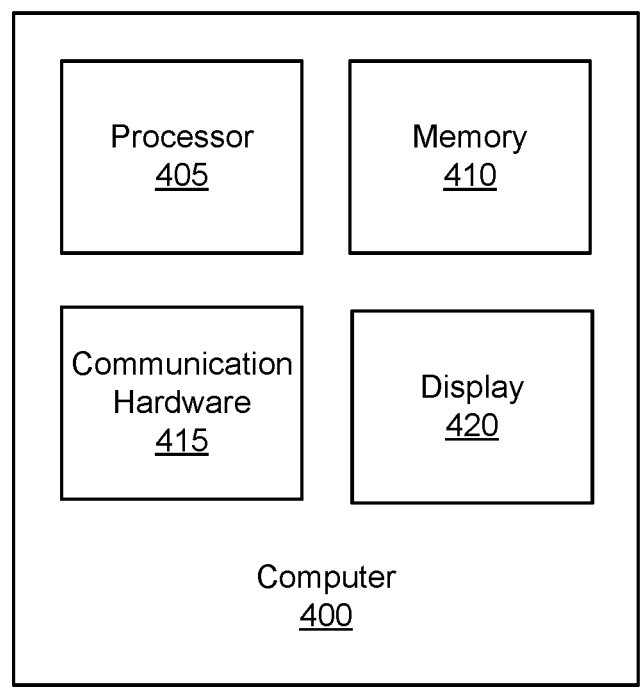
FIG. 4 is a schematic block diagram illustrating one embodiment of a computer.

FIG. 4 is a schematic block diagram illustrating one embodiment of a computer 400. The encoding module 104 and/or the path execution time module 105 may be embodied in the computer 400. In the depicted embodiment, the computer 400 includes a processor 405, a memory 410, communication hardware 415, and a display 420. The memory 410 may be a semiconductor storage device, a hard disk drive, an optical storage device, a micromechanical storage device, or combinations thereof. The memory 410 may store code. The processor 405 may execute the code.

The communication hardware 415 may communicate with other devices. In addition, the communication hardware 415 may receive inputs from a user. The display 420 may communicate data to the user.

Figure 5A:
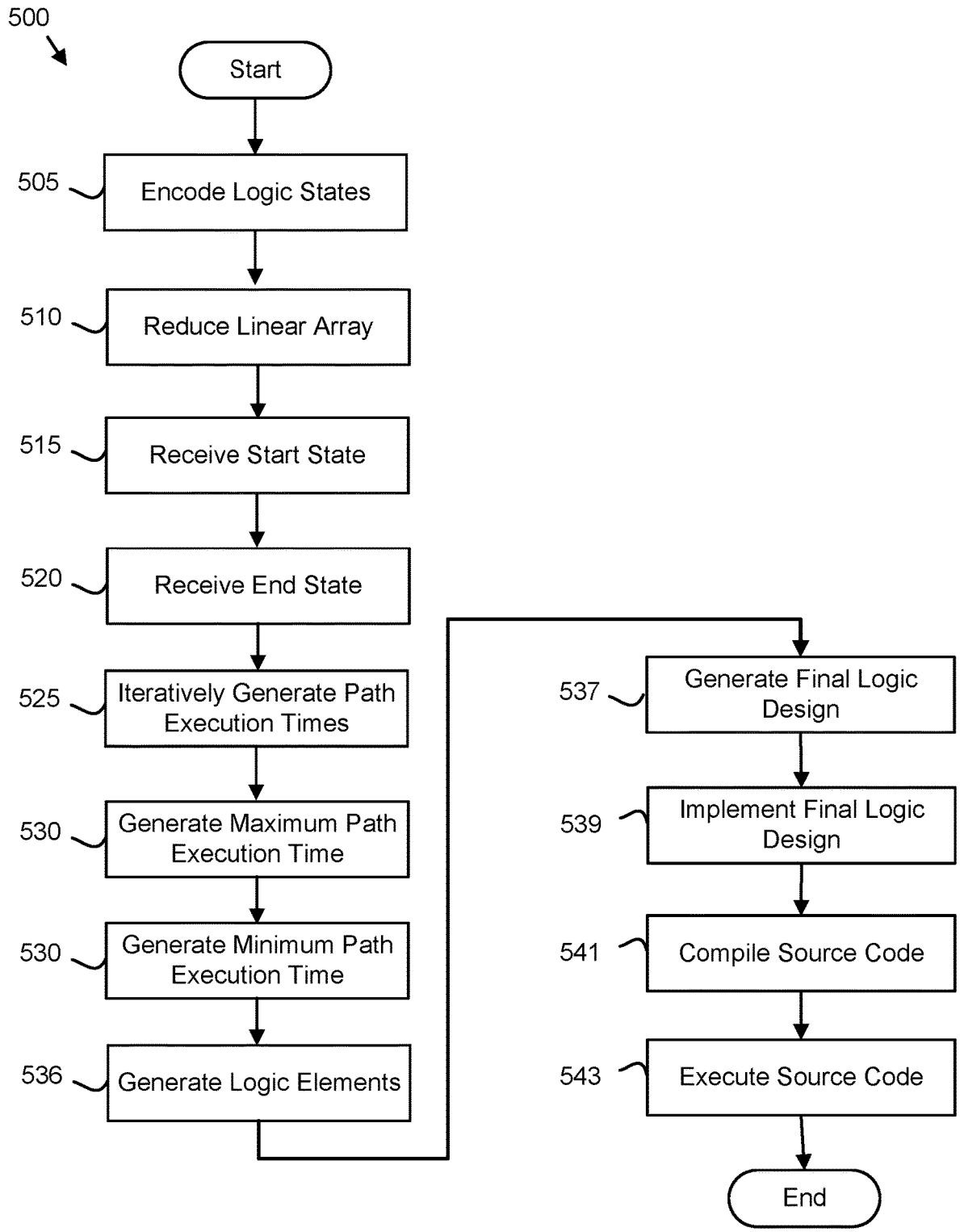
FIG. 5A is a schematic flow chart diagram illustrating one embodiment of a path execution time calculation method.

FIG. 5A is a schematic flow chart diagram illustrating one embodiment of a path execution time calculation method 500. The method 500 may employ the linear array 200 to calculate a path execution time 377 between a start state and an end state. The method 500 may be performed by the processor 405. Alternatively, the method 500 may be performed by the computer readable storage medium such as the memory 410. The memory 410 may store code that is executed by the processor 405 to perform the functions of the method 500.

The method 500 starts, and in one embodiment, the processor 405 encodes 505 the logic design 140 as one or more logic states 205 of a linear array 200. The logic state encoding 505 is described in more detail in FIG. 5B.

In one embodiment, the processor 405 reduces 510 the linear array 200 to a set of minimal logical expressions. The processor 405 may employ one or more of the Quine-McClusky algorithm and Espresso to reduce the linear array 200.

The processor 405 may receive 515 a start state that corresponds to a first logic state 205. In addition, the processor 405 may receive 520 an end state that corresponds to a second logic state 205. In response to receiving the start state in the end state, the processor 405 may iteratively generate 525 path execution times 377 for a path between the start state and the end state. In one embodiment, a path comprises the state transitions between the start state and the end state.

For example, the start state logic state 205 may have a plurality of state transitions to other logic states 205. The next state values 230 of the start state logic state 205 may specify the state transitions. The other logic states 205 may also have state transitions to additional logic states 205 until the end state logic state 205 is transitioned to and activated. In one embodiment, a path comprises a unique set of the state transitions and binary input variable transitions between the start state and the end state.

In one embodiment, a given path execution time 377 for a given state transition to a given subsequent logic state 205 is not generated in response to state transitions for the given subsequent logic state exceeding the transition threshold. The state transitions may be recorded by the state transitions value 343. By not generating the given path execution time, the complexity of generating the path execution time between the start state in the end state is reduced.

In one embodiment, each path execution time 377 is a range of times. In one embodiment, the range of times is generated by varying the timing of one or more binary input variables 215 for the execution times 377 when calculating the path execution time 377. A Monte Carlo simulation may be employed to vary the execution times 377. The path execution time 377 between the start state and the end state may be the range of times. Alternatively, the path execution time may be one of an average of the range of times, a mean of the range of times, and a median of the range of times. The iterative generation 525 of the path execution times is described in more detail in FIG. 5C.

Iteratively generating 525 the path execution times generates a path execution time 377 for each path between the start state and the end state. The processor 405 may further generate 530 a maximum path execution time 377 from the plurality of path execution times 377. The maximum path execution time 377 may be a greatest sum of path execution times for state transitions between the start state and the end state.

In one embodiment, the processor 405 generates 535 a minimum path execution time 377 from the plurality of path execution times. The minimum path execution time 377 may be the smallest sum of path execution times 377 for state transitions between the start state and the end state.

The processor 405 may generate 536 a logic element in the linear array 200 based on the maximum path execution time 377. The processor 405 may generate 537 the final logic design 145 from the linear array 200 based on the minimum path execution time 377. For example, the final logic design 145 may comprise implementations with minimum path execution time 377. The final logic design 145 may include Boolean logic from the linear array 200.

In one embodiment, the processor 405 implements 539 the final logic design 145. The processor 405 may implement 539 the logic design 145 in hardware by fabricating semiconductor gates 103 that implement the Boolean logic. In addition, the processor 405 may implement 539 the logic design in software by generating software code 102 that implements the Boolean logic.

In one embodiment, the processor 405 compiles 541 the software code 102. The processor 405 may further execute 543 the compiled software code 102 on the machine 107 and the method 500 ends.

Figure 5B:
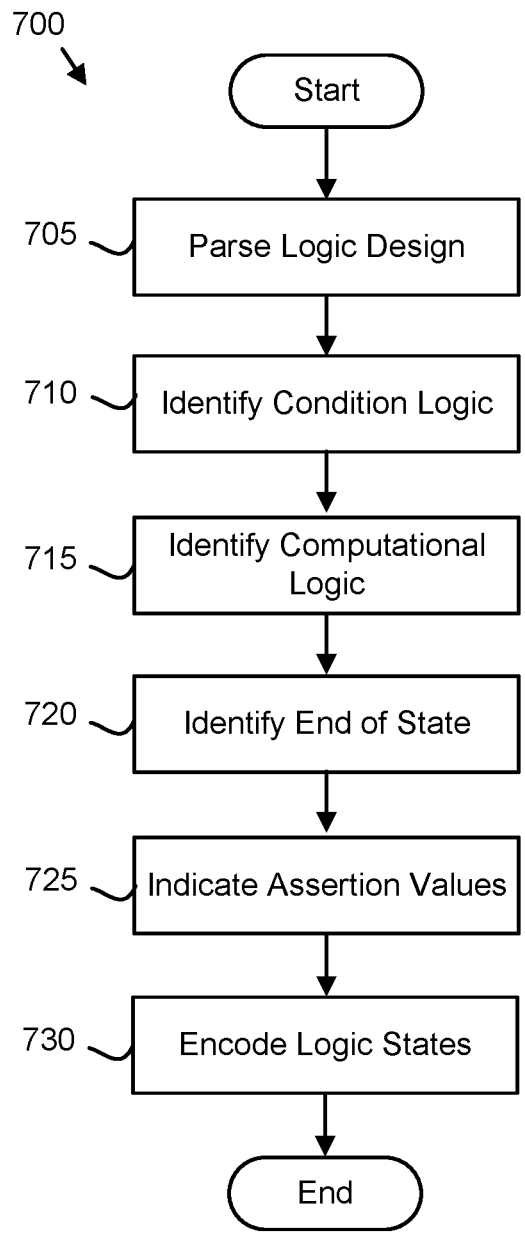
FIG. 5B is a schematic flowchart diagram illustrating one embodiment of a logic state encoding method.

FIG. 5B is a schematic flowchart diagram illustrating one embodiment of a logic state encoding method 700. The method 700 may encode the logic design 140 as one or more logic states 205 of the linear array 200. The method 700 may perform step 505 of FIG. 5A. The method 700 may be performed by the processor 405. Alternatively, the method 700 may be performed by the computer readable storage medium such as the memory 410. The memory 410 may store code that is executed by the processor 405 to perform the functions of the method 700.

The method 700 starts, and in one embodiment, the processor 405 parses 705 the logic design 140 into the logic transformation 150. The processor 405 may segment the logic design 140 into a plurality of logic design elements 130. In one embodiment, each logic design element 130 is a line of the logic design 140. Alternatively, the processor 405 may parse 705 the logic design 140 into logic design elements 130 where each logic design element 130 begins with conditional logic 172. In one embodiment, each logic design element 130 is a data structure of the logic design 140.

The processor 405 may identify 710 conditional logic 172 in each logic design element 130. Identifying 710 the conditional logic 172 may include identifying one or more conditions, one or more results, and/or one or more destinations. In one embodiment, the processor 405 may further identify 710 the next state values 230 for the logic transformation 150 from the conditional logic 172. In addition, the processor 405 may identify 710 the input data 160 for the logic transformation 150 from the conditional logic 172.

In addition, the processor 405 may identify 715 computational logic 134 in each logic design element 130. Identifying 715 the computational logic 134 may include identifying actions 174, identifying computational statements, and the like. The processor 405 may identify 715 the binary output variables 225 for the logic transformation 150 from the computational logic 134. In addition, the processor 405 may identify 715 the input data 160 for the logic transformation 150 from the computational logic 134.

In one embodiment, the processor 405 identifies 720 the end of state 136 for each logic design element 130. The end of state 136 may be an end of a conditional statement, the end of a sequence of instructions that are executed in response to conditional logic 172 being satisfied, or the like.

The processor 405 may indicate 725 assertion values 290 for the binary input variables 215, the present state values 220, the binary output variables 225, and the next state values 230. In one embodiment, an assertion indicator 295 is associated with each of the binary input variables 215, the present state values 220, the binary output variables 225, and the next state values 230.

The processor 405 may encode 730 each logic state 205 from the logic transformation 150 and the method 700 ends. In one embodiment, each logic state 205 is assigned present state values 220. The present state values 220 may be assigned to minimize the minterms 240 and the maxterms 235 that generate the present state values 220. In addition, the next state values 230 for the logic state 205 may be generated from the next state values 230 of the logic transformation 150. In one embodiment, the next state values 230 for the logic state 205 are equivalent to the next state values 230 of the logic transformation 150.

The binary input variables 215 of the logic state 205 may be generated from the binary input variables 215 of the logic transformation 150. In one embodiment, the binary input variables 215 of the logic state 205 are equivalent to the binary input variables 215 of the logic transformation 150.

The processor 405 may further encode 730 the logic state 205 by generating the minterms 240 and the maxterms 235 from the computational logic 134. In one embodiment, the minterms 240 in the maxterms 235 are structured to be logically equivalent to the computational logic 134.

The processor 405 may further assign one or more maxterms 235 to each binary output variable 225 and/or each next state value 230. Alternatively, the processor 405 may assign one or more minterms 240 to each binary output variable 225 and/or each next state value 230.

Figure 5C:
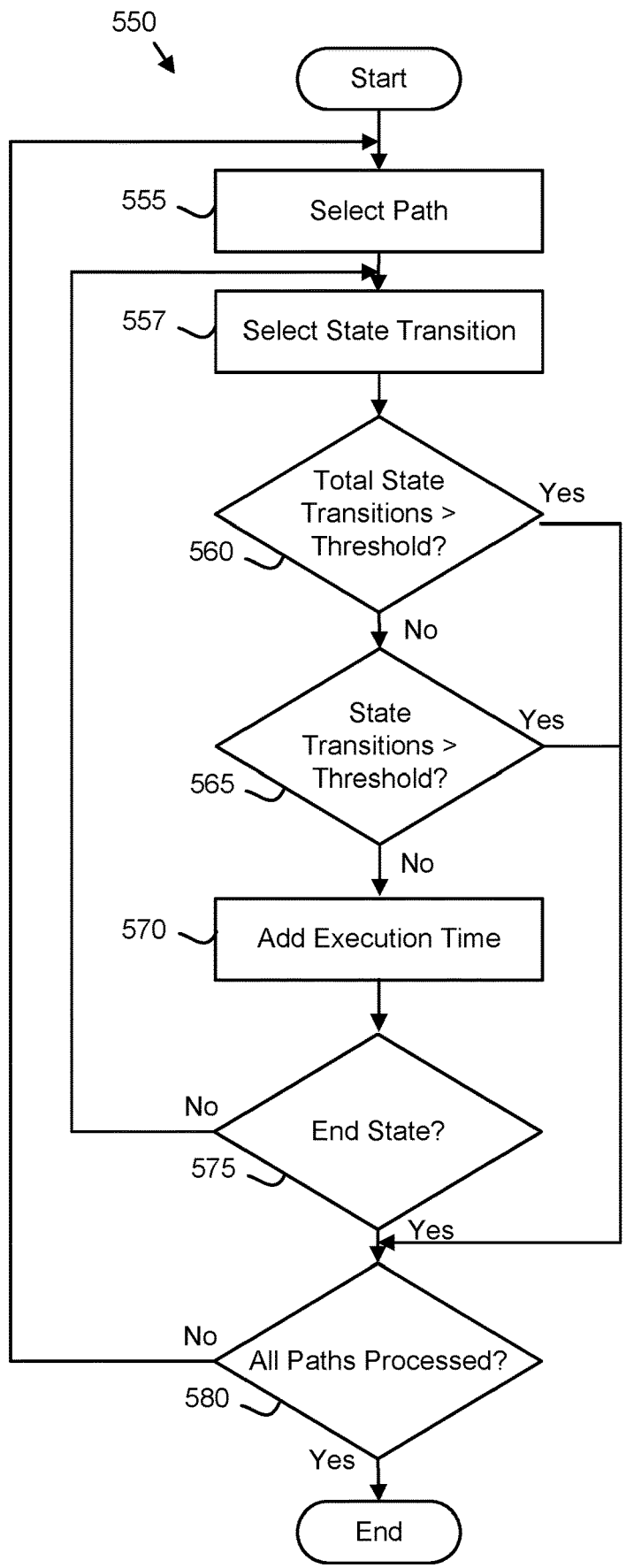
FIG. 5C is a schematic flowchart diagram illustrating one embodiment of an iterative path execution time calculation method.

FIG. 5C is a schematic flowchart diagram illustrating one embodiment of an iterative path execution time calculation method 550. The method 550 may iteratively calculate path execution times 377. The method 550 may be performed by the processor 405. Alternatively, the method 550 may be performed by the computer readable storage medium such as the memory 410. The memory 410 may store code that is executed by the processor 405 to perform the functions of the method 550.

The method 550 starts, and in one embodiment, the processor 405 selects 555 a path between the start state and the end state of the linear array 200. The path may be a previously unselected path. The processor 405 may further initialize a path execution time 377 for the selected path to zero.

The processor 405 further selects 557 a state transition from the current logic state 205, also referred to as a predecessor logic state 205, to a next logic state 205. The state transition may be a previously untraversed state transition.

The processor 405 may determine 560 if a sum of all the state transitions values 343 for all the state transition between logic states 205 that have been traversed for the selected path exceeds a total transition threshold. In one embodiment, the total transition threshold is an integer in the range of 10,000 to 1 million. If the sum of all state transitions values 343 exceeds the total transition threshold, the processor 405 ends processing the path and determines 580 if all paths have been processed.

If the sum of all state transitions values 343 does not exceed the total transition threshold, the processor 405 may determine 565 if the state transitions value 343 for the current logic state 205 exceeds a transition threshold. In one embodiment, the transition threshold is an integer that is greater than the value in the range of 5 to 25. If the state transitions value 343 exceeds the transition threshold, the processor 405 ends processing the path and determines 580 if all paths have been processed as will be described hereafter.

If the state transitions value 343 does not exceed the transition threshold, the processor 405 may add 570 the execution time for the selected state transition to the path execution time 377.

In one embodiment, the processor 405 scans state transitions between the current or predecessor logic state 205 and the next logic state 205 and adds the execution times 377 for the state transitions to the path execution time as part of each scan. The processor 405 may scan a first next state transition at a level lower than the first predecessor logic state 205 as the predecessor logic state 205 if the first next logic state 205 is not an end state and if state transitions from the predecessor logic state 205 do not exceed the transition threshold, if the first next logic state 205 is equivalent to the predecessor logic state 205, and if a number of scans of the first next logic state 205 does not exceed a total transition threshold. The processor 405 further loops to increment the number of state transitions for the next predecessor logic state 205.

In addition, the processor 405 may scan a second next logic state 205 at a level of the predecessor logic state 205 as the predecessor logic state 205 if the second next logic state 205 is not the end state and if state transitions from the predecessor logic state 205 do not exceed the transition threshold or if the second next logic state 205 is equivalent to the predecessor logic state 205, and if a number of scans of the second next logic state 205 does not exceed the total transition threshold, or if the second next logic state 205 is not an end state and if state transitions from the predecessor logic state 205 do not exceed the transition threshold or the second next logic state 205 is equivalent to the predecessor logic state 205, and if state transitions for the second next logic state 205 exceed the transition threshold. The processor 405 may further loop to increment the number of state transitions for the next predecessor logic state 205.

In one embodiment, the processor 405 may scan a third next logic state 205 at a level above the predecessor logic state 205 as the predecessor logic state 205 if the third next logic state 205 is not an end state and if state transitions from the predecessor logic state 205 do not exceed the transition threshold or the third next logic state 205 is equivalent to the predecessor logic state 205, and if a number of scans of the third next logic state 205 does not exceed the total transition threshold, or if the third next logic state 205 is not an end state and if state transitions from the predecessor logic state 205 do not exceed the transition threshold or the third next logic state is equivalent to the predecessor logic state 205, and if state transitions for the third next logic state 205 exceed the transition threshold. The processor 405 may further loop to increment the number of state transitions for the next third predecessor logic state 205.

In one embodiment, the processor 405 may iteratively scan subsequent logic states 205. In addition, the processor 405 may terminate scanning the logic states 205 in response to one of the next logic state 205 being the end state, state transitions for the predecessor logic state 205 exceeding the transition threshold, a number of scans of the next logic state 205 exceeding the total transition threshold. In addition, the processor 405 may sum all the path execution times 377 for the state transitions to yield the path execution time 377 between the start state and the end state. In one embodiment, each path execution time 377 is a range of times.

In one embodiment, the execution time 377 for the state transition from the current logic state 205 to a subsequent logic state 205 is not added 570 to the path execution time in response to the sum of the state transitions 343 exceeding the total state transition threshold.

The processor 405 may determine 575 if the current path is the end state. If the current logic state 205 is the end state, the processor 405 determines 580 if all paths are processed. If the current logic state 205 is not the end state, the processor 405 loops to select 557 the next state transition of the path. Thus, the processor 405 continues to process all state transitions of each path.

If the processor 405 determines 580 that all paths are processed, the method 550 ends. If all paths are not processed, the processor 405 loops to select 555 a new path between the start state and the end state.

Figure 5D:
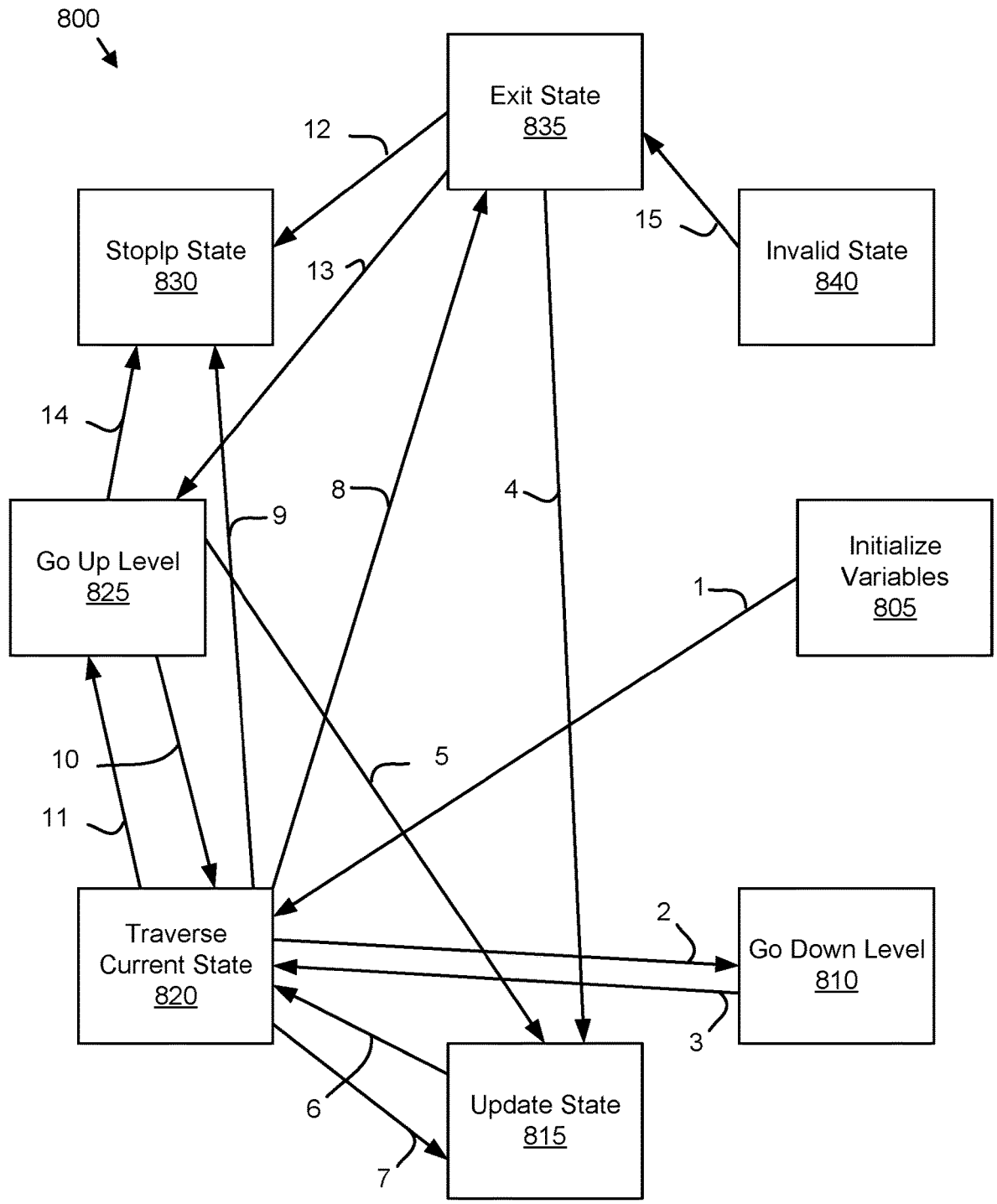
FIG. 5D is a schematic flow chart diagram illustrating one alternative embodiment of an iterative path execution time calculation method.

FIG. 5D is a schematic flow chart diagram illustrating one alternative embodiment of an iterative path execution time calculation method 800. The method 800 may iteratively calculate worst case path execution times 377. The method 800 may be performed by the processor 405. Alternatively, the method 550 may be performed by the computer readable storage medium such as the memory 410. The memory 410 may store code that is executed by the processor 405 to perform the functions of the method 800.

The method 800 starts with the processor 405 initializing 805 variables such as the state transitions value 343 for each logic state 205. Each state transitions value 343 may be set to zero.

The processor 405 may further traverse 820 a logic state 205 on the current level. In one embodiment, the processor 405 increments the state transitions value 343 for the current logic state 205. If the current logic state 205 includes the state transition to a subsequent logic state 205, the processor 405 may record the path execution time for the state transition to the subsequent logic state 205. In addition, the processor 405 may make the subsequent logic state 205 the current logic state 205 and record the state transition. When all paths of the subsequent logic state 205 are traversed, the processor 405 may return to traverse 820 the original current logic state 205.

In one embodiment, the processor 405 updates 815 the current logic state 205 by examining the next binary input variable combination at the level of the current logic state 205. While traversing 820 the current level, if all paths have been traversed, the processor 405 may go up 825 to a logic state 205 at a higher level. When all logic states 205 at the higher level of been traversed, the processor 405 may stop looping 830 and the method 800 ends.

The processor 405 may detect an invalid state 840. In addition, the processor 405 may exit the traverse 835 in response to detecting the invalid state 840.

The Table 1 shows the conditions for each step transition as functions of condition elements, where X is a DON'T CARE that always transitions.

TABLE 1

| State Transition | Inputs |
| --- | --- |
| 1 | X |
| 2 | (/nseqes */nseqss */tcgemt) |

TABLE 1-continued

| State Transition | Inputs |
|---|---|
| 3 | X |
| 4 | (/tsgenc * nseqes) |
| 5 | (/tsgenc */sseqbs) |
| 6 | X |
| 7 | (/tsgenc */nseqes * nseqss) + (/tsgenc */nseqes * tcgemt) |
| 8 | (nseqes) |
| 9 | (tsgenc */nseqes * nseqss *sseqbs) + (tsgenc */nseqes * tcgemt * sseqbs) |
| 10 | (/tsgenc and sseqbs) |
| 11 | (tsgenc */nseqes * nseqss */sseqbs) + ( tsgenc */nseqes * tcgemt */sseqbs) |
| 12 | (tsgenc * nseqes */sseqbs) |
| 13 | (tsgenc * nseqes * sseqbs) |
| 14 | (tsgenc * nseqes * sseqbs) |
| 15 | X |

Table 2 shows a pseudo code definition for each condition element.

TABLE 2

X= Don't care, will always transition.
tsgenc := (Transition_sequence[Transition_cnt] >= ( Number_input_combinations − 1 ))
Nseqes := (( Next_state_test = Ending_state_number ) and not Generate_test_vector)
nseqss := ( ( Next_state_test = State_sequence[Transition_cnt] ) or ( States_visited[Next_state_test] >= Max_number_visits ) )
tcgemt := Transition_cnt >= ( Max_number_transitions − 1 )
sseqbs := State_sequence[Transition_cnt] = Beginning_state_number Table 3 shows a pseudo code definition for each step of the method 800.

TABLE 3

805: { Initialize Variables }
  {Initialize Variables }
810: { Go Down Level}
  { Record this path execution time }
  { Go down to next logic state }
  {This is a valid state transition so record this state transition.}
  {Start out at the zero state transitions value 343 for this state transition.}
815: { UPDATE state }
  { Look at next input combination at this logic state level. }
820: { Traverse Current Level }
  { Increment state transitions value 343 for this logic state 205 }
825: { Go Up Level }
  { Dead end at last logic state, so go back up to a higher logic state level. }
830: { STOPLP state }
  { Stop looping }
835 { EXIT state }
  { Record the total execution path time and exit the traverse. }
840: { INVALD state }
  { Stop traversing state transitions. }

Figure 6A:
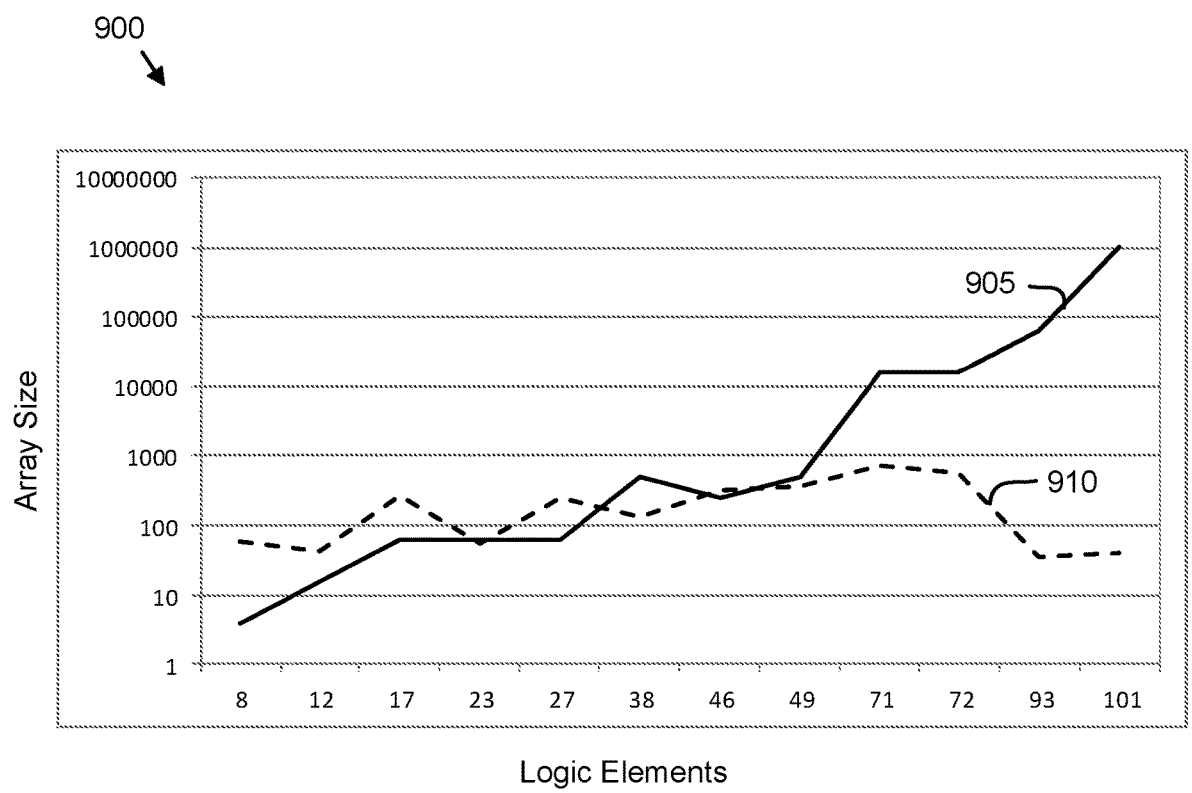
FIG. 6A is a graph illustrating one embodiment of array complexity.

FIG. 6A is a graph 900 illustrating one embodiment of array complexity. The graph 900 shows an array size 905 for a multidimensional array of the logic design 140 and an array size 910 for a corresponding linear array 200 for multiple pairs of identical function implementations with various numbers of logic elements 176. For example, a first function implementation of 27 logic elements 176 may be implemented as a pair of arrays comprising a multidimensional array and a linear array 200. The array size 905, 910 is shown on a log scale. Array size 905, 910 is one measure of array complexity and a good predictor of the computational overhead required to process an array.

The graph 900 illustrates that the array size 905 for multidimensional array implementations quickly becomes orders of magnitude larger than the corresponding array size 910 for linear array implementations. By encoding the logic design 140 as a linear array 200, array size is greatly reduced, reducing the computational complexity of processing the linear array 200.

Figure 6B:
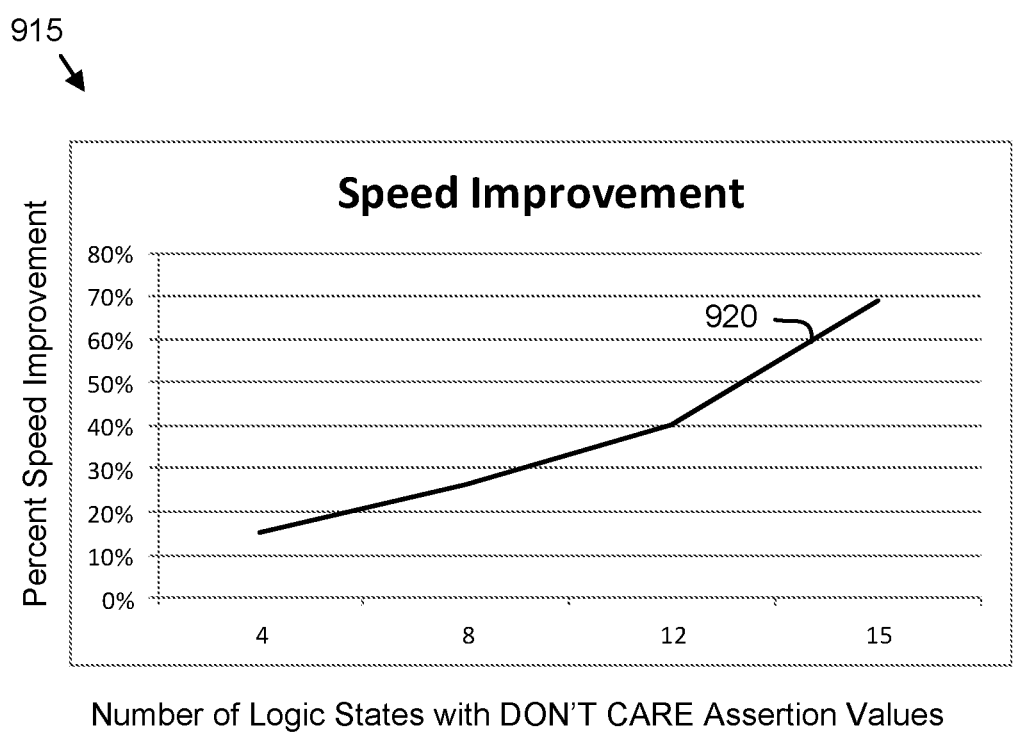
FIG. 6B is a graph illustrating one embodiment of speed improvements from identifying DON'T CARE assertion values.

FIG. 6B is a graph 915 illustrating one embodiment of speed improvements 920 from identifying DON'T CARE assertion values 290. A percentage speed improvement is shown as a result of identifying DON'T CARE assertion values 290 for minterms 240 of 4, 8, 12, and 15 logic states 205 of an exemplary linear array 200. The speed improvement 920 is calculated by comparing processing time for the exemplary linear array 200 without identifying the DON'T CARE assertion values 290, and the processing time for the exemplary linear array 200 when DON'T CARE assertion values 290 are identified for minterms 240 of 4, 8, 12, and 15 logic states 205 of the linear array 240 shown in Table 3. Table 3 shows an estimate of processing time as a function of linear array size for minterms 240 of 4, 8, 12, and 15 logic states 205 having either deasserted assertion values 290 or DON'T CARE assertion values 290.

TABLE 3

| | 4 Logic States | 8 Logic States | 12 Logic States | 15 Logic States |
|---|---|---|---|---|
| Deasserted | 645 | 499 | 362 | 251 |
| DON'T CARE | 547 | 369 | 216 | 78 |

The graph 915 shows the processing perform efficiencies that are realized from identifying DON'T CARE assertion values 290.

By encoding the embodiments as a linear array 200, the embodiments more efficiently generate path execution times 377 for the paths of a logic design 140. As a result, the embodiments may more efficiently generate a maximum and a minimum path execution time 377 for a path between a start state and an end state.

Embodiments may be practiced in other specific forms. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. A method comprising:
  encoding, by use of a processor, a logic design as a linear array comprising a plurality of logic states, each logic state comprising one or more binary output variables, one or more binary input variables, one or more minterms of the one or more binary input variables, one or more maxterms of the one or more minterms, one or more present state values, and one or more next state values;
  iteratively generating a path execution time for each path between a start state and an end state using the linear array to reduce computational overhead, wherein an execution time for a given state transition of a given path is not added to the path execution time in response to state transitions for a given predecessor logic state exceeding a transition threshold; and generating a maximum path execution time between the start state and the end state as a greatest sum of all path execution times for state transitions between the start state and the end state;

generating a logic element in the linear array based on the maximum path execution time;

generating a final logic design comprising Boolean logic from the linear array with the logic element based on the maximum path execution time; and implementing the final logic design in hardware by fabricating semiconductor gates that implement the Boolean logic.

2. The method of claim 1, wherein iteratively generating the path execution time comprises:

incrementing a number of state transitions for a first predecessor logic state;

scanning a first next state transition at a level lower than the first predecessor logic state as the first predecessor logic state if the first next logic state is not an end state and if state transitions from the first predecessor logic state do not exceed the transition threshold or the first next logic state is equivalent to the first predecessor logic state, and if a number of scans of the first next logic state does not exceed a total transition threshold, and looping to increment the number of state transitions for the next first predecessor logic state;

scanning a second next logic state at a level of the first predecessor logic state as the first predecessor logic state if the second next logic state is not an end state and if state transitions from the first predecessor logic state do not exceed the transition threshold or the second next logic state is equivalent to the first predecessor logic state, and if a number of scans of the second next logic state does not exceed the total transition threshold, or if the second next logic state is not an end state and if state transitions from the first predecessor logic state do not exceed the transition threshold or the second next logic state is equivalent to the first predecessor logic state, and if state transitions for the second next logic state exceed the transition threshold and looping to increment the number of state transitions for the next second predecessor logic state;

scanning a third next logic state at a level above the first predecessor logic state as the first predecessor logic state if the third next logic state is not an end state and if state transitions from the first predecessor logic state do not exceed the transition threshold or the third next logic state is equivalent to the first predecessor logic state, and if a number of scans of the third next logic state does not exceed the total transition threshold, or if the third next logic state is not an end state and if state transitions from the first predecessor logic state do not exceed the transition threshold or the third next logic state is equivalent to the first predecessor logic state, and if state transitions for the third next logic state exceed the transition threshold and looping to increment the number of state transitions for the next third predecessor logic state;

iteratively scanning subsequent logic states;

terminating scanning the logic states in response to one of the next logic state being the end state, state transitions for the first predecessor logic state exceeding the transition threshold, and a number of scans of the next logic state exceeding the total transition threshold; and summing all the execution times of the state transitions to yield to the path execution time.

3. The method of claim 1, wherein each path execution time is a range of times.

4. The method of claim 1, wherein a given path execution time for the given path is not generated in response to a sum of state transitions for the given path exceeding a total transition threshold.

5. The method of claim 1, the method further comprising calculating a minimum path execution time for state transitions between the begin state and the end state.

6. The method of claim 1, the method further comprising:
parsing the logic design into a plurality of logic design elements;
identifying conditional logic for each logic design element;
identifying computation logic for each logic design element; and
identifying an end of state logic design element.

7. The method of claim 1, the method further comprising:
organizing the plurality of binary input variables into the plurality of fields in one or more combination maps, each field of the plurality of fields corresponding to a respective display level of a multi-level display format having a top display level combination map and at least one lower display level combination map;
selecting a first field of the plurality of fields, the first field corresponding to a first display level;
identifying combinations of the binary input variables of a successive combination map that logically defines the first field of the plurality of fields, wherein the successive combination map is at a successive display level lower than the first display level;
displaying at each successive display level, combination maps of additional binary input variables that logically define the first field at each successive level until a last display level is reached; and
converting the combination of binary input variables for each display level into a logical expression.

8. A program product comprising a non-transitory computer readable storage medium that stores code executable by a processor to perform:
encoding a logic design as a linear array comprising a plurality of logic states, each logic state comprising one or more binary output variables, one or more binary input variables, one or more minterms of the one or more binary input variables, one or more maxterms of the one or more minterms, one or more present state values, and one or more next state values;
iteratively generating a path execution time for each path between a start state and an end state using the linear array to reduce computational overhead, wherein an execution time for a given state transition of a given path is not added to the path execution time in response to state transitions for a given predecessor logic state exceeding a transition threshold; and
generating a maximum path execution time between the start state and the end state as a greatest sum of all path execution times for state transitions between the start state and the end state;
generating a logic element in the linear array based on the maximum path execution time;
generating a final logic design comprising Boolean logic from the linear array with the logic element based on the maximum path execution time; and
implementing the final logic design in hardware by fabricating semiconductor gates that implement the Boolean logic.

9. The program product of claim 8, wherein iteratively generating the path execution time comprises:
incrementing a number of state transitions for a first predecessor logic state;
scanning a first next state transition at a level lower than the first predecessor logic state as the first predecessor logic state if the first next logic state is not an end state and if state transitions from the first predecessor logic state do not exceed the transition threshold or the first next logic state is equivalent to the first predecessor logic state, and if a number of scans of the first next logic state does not exceed a total transition threshold, and looping to increment the number of state transitions for the next first predecessor logic state;
scanning a second next logic state at a level of the first predecessor logic state as the first predecessor logic state if the second next logic state is not an end state and if state transitions from the first predecessor logic state do not exceed the transition threshold or the second next logic state is equivalent to the first predecessor logic state, and if a number of scans of the second next logic state does not exceed the total transition threshold, or if the second next logic state is not an end state and if state transitions from the first predecessor logic state do not exceed the transition threshold or the second next logic state is equivalent to the first predecessor logic state, and if state transitions for the second next logic state exceed the transition threshold and looping to increment the number of state transitions for the next second predecessor logic state;
scanning a third next logic state at a level above the first predecessor logic state as the first predecessor logic state if the third next logic state is not an end state and if state transitions from the first predecessor logic state do not exceed the transition threshold or the third next logic state is equivalent to the first predecessor logic state, and if a number of scans of the third next logic state does not exceed the total transition threshold, or if the third next logic state is not an end state and if state transitions from the first predecessor logic state do not exceed the transition threshold or the third next logic state is equivalent to the first predecessor logic state, and if state transitions for the third next logic state exceed the transition threshold and looping to increment the number of state transitions for the next third predecessor logic state;
iteratively scanning subsequent logic states;
terminating scanning the logic states in response to one of the next logic state being the end state, state transitions for the first predecessor logic state exceeding the transition threshold, and a number of scans of the next logic state exceeding the total transition threshold; and
summing all the execution times of the state transitions to yield to the path execution time.

10. The program product of claim 8, wherein each path execution time is a range of times.

11. The program product of claim 8, wherein a given path execution time for the given path is not generated in response to a sum of state transitions for the given path exceeding a total transition threshold.

12. The program product of claim 8, the processor further performing calculating a minimum path execution time for state transitions between the begin state and the end state.

13. The program product of claim 8, the processor further performing:
parsing the logic design into a plurality of logic design elements;
identifying conditional logic for each logic design element;
identifying computation logic for each logic design element; and
identifying an end of state logic design element.

14. The program product of claim 8, the processor further performing:
organizing the plurality of binary input variables into the plurality of fields in one or more combination maps, each field of the plurality of fields corresponding to a respective display level of a multi-level display format having a top display level combination map and at least one lower display level combination map;
selecting a first field of the plurality of fields, the first field corresponding to a first display level;
identifying combinations of the binary input variables of a successive combination map that logically defines the first field of the plurality of fields, wherein the successive combination map is at a successive display level lower than the first display level;
displaying at each successive display level, combination maps of additional binary input variables that logically define the first field at each successive level until a last display level is reached; and
converting the combination of binary input variables for each display level into a logical expression.

15. An apparatus comprising:
a processor;
a non-transitory memory that stores code executable by the processor to:
encode a logic design as a linear array comprising a plurality of logic states, each logic state comprising one or more binary output variables, one or more binary input variables, one or more minterms of the one or more binary input variables, one or more maxterms of the one or more minterms, one or more present state values, and one or more next state values;
iteratively generate a path execution time for each path between a start state and an end state using the linear array to reduce computational overhead, wherein an execution time for a given state transition of a given path is not added to the path execution time in response to state transitions for a given predecessor logic state exceeding a transition threshold; and
generate a maximum path execution time between the start state and the end state as a greatest sum of all path execution times for state transitions between the start state and the end state;
generate a logic element in the linear array based on the maximum path execution time;
generate a final logic design comprising Boolean logic from the linear array with the logic element based on the maximum path execution time; and
implement the final logic design in hardware by fabricating semiconductor gates that implement the Boolean logic.

16. The apparatus of claim 15, wherein iteratively generating the path execution time comprises:
incrementing a number of state transitions for a first predecessor logic state;
scanning a first next state transition at a level lower than the first predecessor logic state as the first predecessor logic state if the first next logic state is not an end state and if state transitions from the first predecessor logic state do not exceed the transition threshold or the first next logic state is equivalent to the first predecessor logic state, and if a number of scans of the first next logic state does not exceed a total transition threshold, and looping to increment the number of state transitions for the next first predecessor logic state;

scanning a second next logic state at a level of the first predecessor logic state as the first predecessor logic state if the second next logic state is not an end state and if state transitions from the first predecessor logic state do not exceed the transition threshold or the second next logic state is equivalent to the first predecessor logic state, and if a number of scans of the second next logic state does not exceed the total transition threshold, or if the second next logic state is not an end state and if state transitions from the first predecessor logic state do not exceed the transition threshold or the second next logic state is equivalent to the first predecessor logic state, and if state transitions for the second next logic state exceed the transition threshold and looping to increment the number of state transitions for the next second predecessor logic state;

scanning a third next logic state at a level above the first predecessor logic state as the first predecessor logic state if the third next logic state is not an end state and if state transitions from the first predecessor logic state do not exceed the transition threshold or the third next logic state is equivalent to the first predecessor logic state, and if a number of scans of the third next logic state does not exceed the total transition threshold, or if the third next logic state is not an end state and if state transitions from the first predecessor logic state do not exceed the transition threshold or the third next logic state is equivalent to the first predecessor logic state, and if state transitions for the third next logic state exceed the transition threshold and looping to increment the number of state transitions for the next third predecessor logic state;

iteratively scanning subsequent logic states;

terminating scanning the logic states in response to one of the next logic state being the end state, state transitions for the first predecessor logic state exceeding the transition threshold, and a number of scans of the next logic state exceeding the total transition threshold; and summing all the execution times of the state transitions to yield to the path execution time.

17. The apparatus of claim 15, wherein each path execution time is a range of times.

18. The apparatus of claim 15, wherein a given path execution time for the given path is not generated in response to a sum of state transitions for the given path exceeding a total transition threshold.

19. The apparatus of claim 15, the processor further performing calculating a minimum path execution time for state transitions between the begin state and the end state.

20. The apparatus of claim 15, wherein the processor further:

parses the logic design into a plurality of logic design elements;

identifies conditional logic for each logic design element;

identifies computation logic for each logic design element; and identifies an end of state logic design element.

\* \* \* \* \*